US011501042B2

(12) United States Patent
Steingrimsson et al.

(10) Patent No.: US 11,501,042 B2
(45) Date of Patent: Nov. 15, 2022

(54) DECISIONS WITH BIG DATA

(71) Applicant: Baldur Andrew Steingrimsson, Hillsboro, OR (US)

(72) Inventors: Baldur Andrew Steingrimsson, Hillsboro, OR (US); Kwan Yi, Richmond, KY (US); Robert L Jones, Hillsboro, OR (US); Mikalai Kisialiou, Hillsboro, OR (US); Anand A Kulkarni, Davidson, NC (US)

(73) Assignee: IMAGARS LLC, Wilsonville, OR (US)

( * ) Notice: Subject to any disclaimer, the term of this patent is extended or adjusted under 35 U.S.C. 154(b) by 330 days.

(21) Appl. No.: 16/182,389

(22) Filed: Nov. 6, 2018

(65) Prior Publication Data
US 2019/0087529 A1 Mar. 21, 2019

Related U.S. Application Data

(63) Continuation-in-part of application No. 15/613,183, filed on Jun. 3, 2017, now Pat. No. 10,853,536, which
(Continued)

(51) Int. Cl.
*G06N 3/04* (2006.01)
*G06Q 30/02* (2012.01)
(Continued)

(52) U.S. Cl.
CPC .......... *G06F 30/27* (2020.01); *G06F 16/2465* (2019.01); *G06F 16/3334* (2019.01);
(Continued)

(58) Field of Classification Search
CPC ............ G06F 16/2465; G06F 16/3334; G06F 16/3344; G06F 30/00; G06F 30/12;
(Continued)

(56) References Cited

U.S. PATENT DOCUMENTS 6,627,835 B1 9/2003 Chung et al.
7,337,093 B2 2/2008 Ramani et al.
(Continued)

OTHER PUBLICATIONS

Brown D.C. (2005) Artificial intelligence for design process improvement. In: Clarkson J., Eckert C. (eds) Design process improvement. Springer, London. pp. 158-173. <https://doi.org/10.1007/978-1-84628-061-0_7> (Year: 2005).*
(Continued)

*Primary Examiner* — Steven W Crabb

(57) ABSTRACT

This invention presents a framework for applying artificial intelligence to aid with product design, mission or retail planning. The invention outlines a novel approach for applying predictive analytics to the training of a system model for product design, assimilates the definition of meta-data for design containers to that of labels for books in a library, and represents customers, requirements, components and assemblies in the form of database objects with relational dependence. Design information can be harvested, for the purpose of improving decision fidelity for new designs, by providing such database representation of the design content. Further, a retrieval model, that operates on the archived design containers, and yields results that are likely to satisfy user queries, is presented. This model, which is based on latent semantic analysis, predicts the degree of relevance between accessible design information and a query, and presents the most relevant previous design information to the user.

19 Claims, 25 Drawing Sheets

Related U.S. Application Data is a continuation-in-part of application No. 14/567,516, filed on Dec. 11, 2014, now Pat. No. 9,923,949.

(60) Provisional application No. 62/583,377, filed on Nov. 8, 2017, provisional application No. 61/969,655, filed on Mar. 24, 2014.

(51) Int. Cl.
*G06F 16/33* (2019.01)
*G06F 16/2458* (2019.01)
*G06N 3/02* (2006.01)
*G06F 30/27* (2020.01)

(52) U.S. Cl.
CPC .......... *G06F 16/3344* (2019.01); *G06N 3/04* (2013.01); *G06Q 30/0202* (2013.01)

(58) Field of Classification Search
CPC .......... G06F 30/13; G06F 30/17; G06F 30/20; G06F 30/3323; G06F 30/367; G06F 8/10; G06F 30/27; G06N 20/00; G06N 3/04; G06N 3/0454; G06N 3/08; G06N 5/02; G06N 5/022; G06N 5/04; G06N 7/005; G06N 20/10; G06Q 10/06; G06Q 10/063; G06Q 10/0635; G06Q 10/0637; G06Q 10/0639; G06Q 30/0202
See application file for complete search history.

(56) References Cited

U.S. PATENT DOCUMENTS

| | | | |
|---|---|---|---|
| 7,437,344 | B2 | 10/2008 | Peyrelevade |
| 8,429,174 | B2 | 4/2013 | Ramani et al. |
| 9,383,895 | B1 | 7/2016 | Vinayak et al. |
| 10,331,808 | B1* | 6/2019 | Kanthasamy ........... G06F 30/23 |
| 10,776,691 | B1* | 9/2020 | Ghahramani ........... G06N 3/08 |
| 2003/0090530 | A1 | 5/2003 | Ramani et al. |
| 2006/0020629 | A1 | 1/2006 | Ramani et al. |
| 2006/0114252 | A1 | 6/2006 | Ramani et al. |
| 2012/0296611 | A1* | 11/2012 | Teller ...................... G06F 30/13 703/1 |
| 2012/0323535 | A1* | 12/2012 | Teller ............... G06Q 10/06313 703/1 |
| 2013/0173223 | A1* | 7/2013 | Teller ...................... G06F 30/13 703/1 |
| 2018/0068271 | A1* | 3/2018 | Abebe ................. G06Q 10/103 |
| 2018/0174088 | A1 | 6/2018 | Brown |
| 2018/0248904 | A1* | 8/2018 | Villella ................. G06N 20/10 |
| 2020/0272911 | A1* | 8/2020 | Quiros Araya .......... G06N 3/08 |

OTHER PUBLICATIONS

U.S. Appl. No. 14/567,516, filed Dec. 11, 2014, B. Steingrimsson.
U.S. Appl. No. 15/613,183, filed Jun. 3, 2017, B. Steingrimsson, Yi.

* cited by examiner

DECISIONS WITH BIG DATA

ACKNOWLEDGEMENT OF FEDERAL FUNDING

This utility patent is the result of research conducted under support of National Science Foundation Awards 1,447,395 and 1,632,408.

CROSS REFERENCE TO RELATED APPLICATIONS

U.S. Pat. No. 9,923,949 B2, issued on Mar. 20, 2018.
Provisional patent application No. 62/345,760, filed on Jun. 4, 2016.
Utility patent application Ser. No. 15/613,183, filed on Jun. 3, 2017.
Provisional patent application No. 62/583,377, filed on Nov. 8, 2017.

BACKGROUND OF THE INVENTION

1. Technical Field Description

This invention presents a high-level framework for applying artificial intelligence (predictive analytics) to numerous areas of engineering product design, to mission or to retail planning. We also present a querying engine, utilizing an information retrieval framework, capable of providing teams (workforces) with information similar to the ones harvested in a database, for the purpose of improving efficiency and efficacy. Just as one example involving engineering focus, the information provided can consist of design ideas for concept design. As another example, the querying engine can, when combined with user interactions, help with assessment of engineering requirements that are more difficult to assess automatically.

There presently is significant interest in big data analytics, especially within the automotive industry. Large amounts of data are collected from fleets of vehicles. The data is being uploaded to cloud systems, where it is analyzed using big data and machine learning algorithms. Then, information of interest can be communicated to drivers for system feedback. In addition, some streaming data can be made available to automotive vendors for efficiency and maintenance monitoring, or used internally by an original equipment manufacturer for post-mortem failure analysis. Large companies in the automotive industry analyze the data collected, in search for insights, that can help them provide better value to their customers, and help them make better business decisions.

Similarly, CAD design tools generate lots of data. There is interest in harvesting information from past designs, even designs that eventually have not received selection for implementation, but may fulfill the design requirements, for the purpose of providing predictions aimed at aiding future design projects. This begs the question: How to optimally make use of data from past design projects to help with future designs?

Further, as manufacturing processes become more complex, and the data produced by different steps in the manufacturing process becomes more abundant, it has become possible to merge traditional metrology and analysis techniques with big data concepts.

Another related application involves mission planning. The military has traditionally relied on information (data) for important decisions. There presently is interest in combining the power of data analytics with the management and execution of missions, to better arm leaders with the information they need, when they need it. The data analytics may provide insights on patterns in adversarial nations' behaviors to help predict when missile launches will occur or when forces are being mobilized. The analytics can also help identify new transit routes and prepositioning of provisions, to reduce resupply times, and improve responses to contingencies. And when a situation takes an inevitable or unexpected turn, mission analytics can help leaders respond quickly, and reallocate assets to ensure the force remains ready and optimally placed. The purpose of the data analytics is to empower, but not overwhelm.

Yet, another related application involves retail planning and supply chain management. Large shoe and apparel vendors, such as Nike, have been exploring ways to harvest analytics for the purpose of anticipating customers' preferences, customizing (personalizing) and simplifying the customers' shopping experience, in particular the digital shopping experience.

With utilization of big data on the rise, such as within the automotive or retail industries, applications to the process of product design or mission planning have been aspiring, but still relatively limited.

2. Description of Prior Art 2.1 Artificial Intelligence and Big Data Analysis in Context with the Engineering Design Process
1. Initial Work In (Brown 2005), AI was used to improve the way that agents (people or machines) design things (i.e., to design process improvements). In this invention, a framework is presented, which relies on archival of design information into properly structured databases, on information retrieval, and semantic analysis. The framework presented in (Brown 2005) is more in line with methods employed by search engines, such as the one by Google, or by intelligent personal assistants, such as Amazon Alexa (Alexa 2017), Google Assistant (GoogleAssistant 2017) or Google Home (Home 2017).
2. Machine Learning for Recommending Design Methods (Fuge 2014) presents algorithms, that automatically learn patterns in design methods used, by computationally analyzing design case studies. By using case studies as training data, the algorithms can recommend a method, or a set of methods, that are most suitable for a given case.
3. Database Structures Harvesting Design Repositories Suitable for Big Data Analytics In (SteingrimssonYi 2017), database structures harvesting design repositories suitable for big data analytics were presented. This invention provides further context to, and dependencies between, the database structures from (SteingrimssonYi 2017). These database entities are presented primarily in the context of mechanical product design and their functional origin emphasized.

In addition to (SteingrimssonYi 2017), the big data framework is largely motivated by Dr. Yi's and Dr. Steingrimsson's previous work from (Yi 2009) and (Steingrimsson 2014).
4. Fast Searches of Large Design Databases and Ontology-Based Design Information Extraction The most relevant prior art likely involves (Ramani 2013), (Iyer 2003), (KuiyangLou 2003), (LiRamani 2007) and (SinhaBai 2016).

In (Ramani 2013), (Iyer 2003) and (KuiyangLou 2003), techniques are provided for searching on three dimensional (3D) objects across large, distributed repositories of 3D models. 3D shapes are created for input to a search system; optionally user-defined similarity criterion is used, and search results are interactively navigated and feedback received for modifying the accuracy of the search results. Search input can also be given by picking 3D models from a cluster map or by providing orthographic views for the 3D model. Feedback can be given by a searcher as to which models are similar and which are not. Various techniques adjust the search results, according to feedback given by the searcher, and present the adjusted results to the searcher.

(LiRamani 2007) proposes to use shallow natural language processing and domain-specific design ontology, to automatically construct a structured and semantic-based representation from unstructured design documents, for design information retrieval. Design concepts and relationships of the representation are recognized from the document, based on the linguistic patterns identified. The recognized concepts and relationships are joined to form a concept graph. The integration of these concept graphs builds an application-specific design ontology, which can be seen as structured representation of content of a corporate document repository, as well as an automatically populated knowledge based from previous designs.

In (SinhaBai 2016), the authors adopt an approach for converting a 3D shape into a 'geometry image', so that standard convolutional neural network can directly be used to learn 3D shapes. The authors qualitatively and quantitatively validate that creating geometry images using authalic parametrization on a spherical domain is suitable for robust learning of 3D shape surfaces. This spherically parameterized shape is then projected and cut to convert the original 3D shape into a flat and regular geometry image. The authors propose a way to implicitly learn the topology and structure of 3D shapes using geometry images encoded with suitable features. The authors then show the efficacy of their approach for learning 3D shape surfaces for classification and retrieval tasks on non-rigid and rigid shape datasets.

Further examples of prior art are referenced in (Ramani 2013), (Iyer 2003), (KuiyangLou 2003), (LiRamani 2007) and (SinhaBai 2016).

This invention differs from (Ramani 2013), (Iyer 2003), (KuiyangLou 2003), (LiRamani 2007) and (SinhaBai 2016) in the sense that this invention analyzes designs at the project (requirement) level. The prior art by Ramani et. al. involves analysis of designs at the solid model (the geometric modeling) level.

5. Application of Artificial Intelligence Towards Faster Design and Manufacturing (BethO'Leary 2018) reports on Dr. Kim and much of the faculty at MIT's Department of Mechanical Engineering creating new software that connects with hardware to create intelligent devices. They are attempting to build an actual physical neural network on a letter paper size. They are building artificial neurons and synapses on a small-scale water. They are also looking into AI as a way to improve quality assurance in manufacturing, and to design more effectively. They refer to it as hybrid intelligence for design. The goal is to enable effective collaboration between intelligent tools and human designers.

2.2 Artificial Intelligence or Big Data Analysis in the Automotive Industry

Autonomous driving has been the subject of intense research and much publicity, in part due to fatal crashes in California and Arizona (JackStewart 2018), (NathanBomey 2018). Areas of focus have included management of the data collected, quality of the data, traceability, security, privacy, authentication, telematics, and ultimately ownership and monetization of the data.

Companies like Daimler Trucks North America operate, and collect data from, a fleet of test vehicles, apply AI to identify anomalies in the data, and analyze. The analysis can include fusion of data from different types of sensors (cameras, radars and LIDARs), or inertial measurement units, real-time localization of objects in the scene, as well as identification of driver behavior. The goal is to apply big data analytics to the large amounts of data collected, for purpose of identifying how to offer better value to the customers and make better business decisions.

2.3 Artificial Intelligence and Big Data Analysis in Engineering Education

Dr. Ashok Goel pioneered the development of virtual teaching assistants, such as Jill Watson, for answering questions in online discussion forums. Jill Watson is implemented on IBM's Watson super-computing platform and utilizes gradient descent (IbmWatson 2018), (GoelJoyner 2016), (GoelJoyner 2017), (GoelPolepeddi 2017).

2.4 Application of Artificial Intelligence or Big Data Analysis to Mission Planning AI, and various versions of ML, have been applied to many fields such as cancer research, complex games like Jeopardy, Poker, and GO, and more recently heart attack prediction with considerable success (Hutson 2017). These techniques have begun to be investigated and researched related to the topic of military mission planning.

The ability to learn and update asset performance models has been demonstrated in certain mission planning domains (Ozisikyilmaz 2008), which could prove useful in learning predictive asset performance models, such as the ones used by the Navy. Likewise, task model learning has been demonstrated with hierarchical task network learning (Garland 2003), (Yang 2014), and explanation-based learning (Mohan 2014).

Successful mission planning requires accurate and complete models of the performance capabilities of the assets, of the environment (including behavior of other agents in the environment), of the mission goals and sub-goals. Current practice for planning in situations that change is to hand-code the changes in the models of capability, environment, and goals and then re-plan. This approach is slow and becomes infeasible in highly dynamic situations, particularly in tactical mission planning where the tempo of new information requires rapid changes in the models. The data in the models may become inconsistent or obsolete faster than our ability to hand-code new models. This can severely degrade the quality and effectiveness of automated planning aids to a degree that they may not be used. This problem is further exacerbated by the introduction of unmanned assets, especially if there are frequent changes to their sensing and autonomous capabilities. The Navy needs methods that can rapidly and continuously plan as new information, that prompts updating the models, becomes available (Ponirakis 2018), (Attick 2018).

2.5 Application of Artificial Intelligence or Big Data Analysis to Retail Planning In recent years, there has been significant interest in applying AI for the purpose of customizing (personalizing) and simplifying the customers' shopping experience. (DennisBrown 2016) presents a system, method and user interface for providing retail salesperson(s) with a sales acceleration system, using a mobile computing device, a gamification system, an integration engine, that provides access to existing corporate data, media resources communications facilities, and management structures, together with a learning machine. The learning machine selects products to offer customers, based on spend profile, multi-channel sales interest, inventory and emotional state. The goal here is to allow salesperson(s) to individualize customer product offerings with the highest predictive probability score for purchase. (Peyrelevade 2008) presents an artificial intelligence engine for providing beauty advice. The beauty advice can include a recommendation for a product.

In addition, there are significant commercialization activities. Invertex provides technology for analyzing customers' feet in-store or at home and suggesting what models or sizes might fit the customers best. Oak Labs has built an interactive dressing room mirror that can display merchandise in different sizes and colors for shoppers, make stylist recommendations for accessorizing a look, and more. Satisfi Labs uses AI to help shoppers more easily navigate stores and other locations to find what they are looking for. SupplyAI provides a system of intelligence for efficient retail customer service. SupplyAI claims to be building the world's 1st AI powered platform that helps omni-channel retailers predict and prevent returns. ReturnSense™ utilizes SupplyAI's proprietary algorithm, for recognizing patterns in purchase behavior and predicting the likelihood of return on every purchase made. It sends a preventative alert to retailers and validates the purchase, before the products are shipped (SupplyAI 2018).

2.6 Latent Semantic Indexing and Analysis

In (Yi 2009), indexing values of social tags in the context of an information retrieval model were assessed using a latent semantic indexing method. Socially tagged resources were classified into ten Dewey Decimal Classification main classes. Then social tags assigned to the resources were used to represent them in LSI. Similarities between resources were measured, and the aggregated similarities, according to the ten DDC main classes, were compared.

3. Linkage with Automatic Assessment of Engineering Requirements

This invention can be linked with automatic assessment of engineering requirements, i.e., the e-design assessment from (SteingrimssonYi 2017). One can limit the automatic assessment to parameters that one can reliably extract from design tools, such as SolidWorks. To begin with, the automatic assessment may be limited to parameters such as weight, physical dimensions or surface area. Here, there is no interpretation involved, and hence, no chance of errors in the assessment. Other categories, like ergonomics, may be more difficult to assess automatically.

For the more difficult categories of engineering requirements, this invention provide tools and resources, along the lines of FIG. 1, enabling users to query for what they want. This tool might inform designers
1. What is the standard size of a screw?
2. What is the size of the bearing?
3. What is the maximum stress?
4. What is the weight?
5. What is the geometry?

This type of engineering-focused querying mechanism may be very useful. We structure the automatic assessment such that it involves user interactions. The approach for associating engineering requirements with the categories is outlined in FIG. 2. Table 1 summarizes the 24 categories listed in FIG. 2, along with the association with the source files for detailed design:

TABLE 1

Source files corresponding to the 24 categories of engineering requirements.

| No. | Category | Relevant Source Files (from Design Tool) |
|---|---|---|
| 1 | Aesthetics | Color, Shape, Form, Texture, Finish, . . . |
| 2 | Company Procedures | Company Requirement, Certain Standard such as GD&T or ISO 9000 |
| 3 | Competition | Marketing |
| 4 | Cost | Product, Manufacture, Tools |
| 5 | Disposal | Recyclable, Bio-Degradable, Green, . . . |
| 6 | Documentation | Legal Issues; Litigation, Safety, Operation & Service Documents |
| 7 | Environment | Temperature Range, Rain, Humidity, Dust, . . . |
| 8 | Ergonomics/Operation | Users/Buyers Need, Marketing, |
| 9 | Function | Users Requirement, Company Requirement, System/Sub-system Accomplishment |
| 10 | Installation | Connection Geometry, Models to Install |
| 11 | Life in Service | Years, Cycles, . . . |
| 12 | Maintenance | Professional/Government/Industry Guideline, Company Preference |
| 13 | Manufacturing | Buyers Demand, Cost, Warranty, Marketing, Quality Assurance, . . . |
| 14 | Materials | Company Guidelines, Regulations Restrict, Marketing, Codes |
| 15 | Packaging | Package Sizes, Weight, Damage Resistance, Cost |
| 16 | Patents/Legal | Liability Law Suits Associated with Similar Products, Relevant Patents |
| 17 | Performance | Speed, Capacity, Power, Efficiency, Accuracy, Return on Investment, . . . |
| 18 | Quality/Reliability | Company Warranty, Failure Rate, . . . |
| 19 | Quantity | Company Requirement, Marketing, . . . |
| 20 | Safety | Government Requirement, Professional Codes and Standards, Warning Labels, Degrees of Abuse, . . . |
| 21 | Shipping | Package Sizes, Weight, Damage Resistance, Distance, Cost |
| 22 | Size/Volume | Dimension, Volume, . . . |
| 23 | Timelines | Management, Company Requirement, . . . |
| 24 | Weight | Desired Weight, Modular, Lifting Points, . . . |

As indicated above, this invention provides querying mechanism to complement assessment of requirements from categories that may be more difficult to assess automatically. The querying mechanism operates at the project or concept level. In (SteingrimssonYi 2017), the invention utilizes queries, run at the component or assembly level, for verification of requirements that are relatively easy to assess automatically.

In addition to the querying mechanism for helping with verification of requirements from categories, that are more difficult to assess automatically, this invention is also linked with the requirement verification of (SteingrimssonYi 2017) through the definition of known, good designs. We define known, good designs as design with all the design requirements fulfilled (and properly verified). The automatic requirement verification can be used to expedite the qualification of designs from a (large) legacy database of known, good designs. For further information, refer to the description of incremental re-training below.

The design Ecosystem of (Steingrimsson 2014), (SteingrimssonYi 2017) was presented, in part, to provide integration across a perceived void between design requirements and results.

REFERENCES (Brown 2005) D. C. Brown, Artificial Intelligence for Design Process Improvement, In: Clarkson J., Eckert C. (eds) Design Process Improvement. Springer, London, p. 158-173, 2005.

(Alexa 2017) Wikipedia, Amazon Alexa, https://en.wikipedia.org/wiki/Amazon_Alexa, 2017.
(Home 2017) Wikipedia, Google Home, https://en.wikipedia.org/wiki/Google_Home, 2017.
(GoogleAssistant 2017) Wikipedia, Google Assistant, http://en.wikipedia.org/wiki/Google_Assistant, 2017.
(Fuge 2014) M. Fuge, B. Peters and A. Agogino, Machine Learning Algorithms for Recommending Design Methods, J. Mechanical Design, 136 (10) 101103, Aug. 18, 2014.
(SteingrimssonYi 2017) B. Steingrimsson and S. Yi, Digital Ecosystem for Engineering Team Design, U.S. Utility patent application Ser. No. 15/613,183, filed on Jun. 3, 2017.
(Yi 2009) K. Yi, A Study of Evaluating the Value of Social Tags as Indexing Terms. In S. Chu, W. Ritter, & S. Hawamdeh (Eds.), Managing Knowledge for Global and Collaborative Innovations, Hackensack, N.J.: World Scientific Publishing. Conference paper presented at the 6$^{th}$ International Conference on Knowledge Management, Hong Kong, December 3, p. 221-232, 2009.
(Steingrimsson 2014) B. Steingrimsson, "All-Electronic Ecosystems for Design and Collaboration". U.S. patent Publication Ser. No. 14/567,516, Dec. 11, 2014.
(Schaffernict 2011) M. Schaffernicht & S. N. Groesser, "A comprehensive method for comparing mental models of dynamic systems," European Journal of Operational Research, vol. 210(1), no. https://doi.org/10.1016/j.ejor.2010. 09.003, pp. 57-67, 2011.
(Duda 2001) R. O. Duda, P. E. Hart and D. G. Stork, Pattern Classification, 2$^{nd}$ edition, Wiley, 2001.
(Salton 1975) G. Salton, A vector space model for automatic indexing. Communications of the ACM, 18 (11), pp. 613-620, 1975.
(Deerwester 1990) S. Deerwester, S. T. Dumais, G. W. Furnas, T. K. Landauer and R. Harshman, Indexing by latent semantic analysis, Journal of the American Society for Information Science, 41 (6), pp. 391, 1990.
(Dumais 2004) S. T. Dumais, Latent Semantic Analysis, Annual Review of Information Science and Technology, 38(1), pp. 188-230, 2004.
(Laundauer 2007) T. Landauer, D. McNamara, S. Dennis and W. Kintsch, Handbook of Latent Semantic Analysis, University of Colorado Institute of Cognitive Science Series, 2007.
(Widrow 1960) B. Widrow and M. E. Hoff, Adaptive Switching Circuits, in IRE WESCON Convention Record, Vol. 4, New York, pp. 96-104, 1960.
(Spark 2017) Spark Developer Documentation, Spark API, https://sparkplatform.com/docs/overview/api, 2017.
(BigData 2017) Big Data Zone, Hadoop REST API—WebHDFS, http://dzone.com/articles/hadoop-rest-api-webhdfs, 2017.
(Hadoop 2017) Hadoop, WebHDFS REST API, https://hadoop.apache.org/docs/r1.0.4/webhdfs.html, 2017.
(Kerberos 2017) Wikipedia, Kerberos (protocol), https://en.wikipedia.org/wiki/Kerberos_(protocol), 2017.
(Trefethen & Bau III 1997) David Bau III (1997). Numerical linear algebra. Philadelphia: Society for Industrial and Applied Mathematics. ISBN 978-0-89871-361-9, 1997.
(DataScienceCentral 2018) Data Science Central, Artificial Intelligence vs. Machine Learning vs. Deep Learning, https://www.datasciencecentral.com/profiles/blogs/artificial-intelligence-vs-machine-learing-vs-deep-learning, 2018.
(Ozisikyilmaz 2008) Ozisikyilmaz, Memik, Choudhary, Machine Learning Models to Predict Performance of Computer System Design Alternatives. In Proceedings of 37th International Conference on Parallel Processing. cucis.ece.northwestern.edu/projects/DMS/publications/OziMem08B.pdf, 2008.
(Garland 2003) Lesh Garland, Learning Hierarchical Task Models by Demonstration. Technical Report TR2003-01, Mitsubishi Electric Research Laboratoriesk cs.brandeis.edu/~aeg/papers/garland.tr2002-04.pdf, 2003.
(Mohan 2014) Laird Mohan, Learning Goal-Oriented Hierarchical Tasks from Situated Interactive Instruction. Proceedings of the 27th AAAI Conference on Artificial Intelligence (AAAI), web.eecs.umich.edu/~soar/sitemaker/docs/pubs/mohan_AAAI_2014.pdf, 2014.
(Yang 2014) Munoz-Avila, Zhuo Yang, Learning Hierarchical Task Network Domains from Partially Observed Plan Traces. Artificial Intelligence Journal, cse.lehigh.edu/%7Emunoz/Publications/AIJ14.pdf, 2014.
(Ramani 2013) Karthik Ramani, Natraj Iyer, Kuiyang Lou, and Subramaniam Jayanti, Methods, Systems, and Data Structures for Performing Searches on Three Dimensional Objects, U.S. Pat. No. 8,429,174 B2, Granted on Apr. 23, 2013.
(Iyer 2003) Natraj Iyer, Yagnanarayanan Kalyanaraman, Kuiyang Lou, Subramaniam Jayanti and Karthaik Ramani, A Reconfigurable 3D Engineering Shape Search System Part I: Shape Representation, ASME 2003 International Design Engineering Technical Conferences and Computers and Information in Engineering Conference, 2003.
(KuiyangLou 2003) Kuiyang Lou, Subramaniam Jayanti, Natraj Iyer, Yagnanarayanan Kalyanaraman, Sunil Prabhakar and Karthik Ramani, A Reconfigurable 3D Engineering Shape Search System: Part II—Database Indexing, Retrieval, and Clustering, ASME 2003 International Design Engineering Technical Conferences and Computers and Information in Engineering Conference, 2003.
(LiRamani 2007) Zhanjun Li and Karthik Ramani, Ontology-Based Design Information Extraction and Retrieval, Artificial Intelligence for Engineering, Design, Analysis and Manufacturing, 21, pp. 137-154, 2007.
(SinhaBai 2016) Ayan Sinha, Jing Bai and Karthik Ramani, Deep Learning 3D Shape Surfaces Using Geometry Images. In: Leibe B., Matas J., Sebe N., Welling M. (eds) Computer Vision—ECCV 2016. ECCV 2016. Lecture Notes in Computer Science, vol 9910. Springer, Cham, 2016.
(BethO'Leary 2018) Mary Beth O'Leary, Revolutionizing Everyday Products with Artificial Intelligence, MIT News, http://digital.d2pmagazine.com/?issueID=42&pageID=51, p. 48-53, September, 2018.
(IbmWatson 2018) Watson, IBM website.ibm.com/watson, 2018.
(GoelJoyner 2016) A. Goel and D. Joyner, An experiment in teaching artificial intelligence online. Journal for Scholarship of Technology-Enhanced Learning 1 (1), 2016.
(GoelJoyner 2017) A. Goel and D. Joyner, Using AI to teach AI. AI Magazine 38(2), 2017.
(GoelPolepeddi 2017) A. Goel and L. Polepeddi, Jill Watson: A virtual teaching assistant for online education. Presented to the Learning Engineering for Online Learning Workshop, Harvard University, June 2017. To appear as a chapter in Dede, C., Richards, J., & Saxberg, B., Editors (in preparation), Education at scale: Engineering online teaching and learning. NY: Routledge, 2017.
(Hutson 2017) Matthew Hutson. "Self-taught artificial intelligence beats doctors at predicting heart attacks." Science Magazine, sciencemag.org/news/2017/04/self-taught-artificial-intelligence-beats-doctors-predicting-heart-attacks, Apr. 14, 2017.

(SupplyAI 2018) AngelList, SupplyAI, https://angel.co/supplyai/, 2018.

(Houser 2017) Nathan Houser and Ted Johnson, Data-Driven Deployments—How Analytics Can Transform Military Positioning, https://www2.deloitte.com/insights/us/en/industry/public-sector/mission-analytics-military-deployments.html, Oct. 2, 2017.

(Ponirakis 2018) Lore-Anne Ponirakis, Learning Performance Models and Tactical Knowledge for Continuous Mission Planning, Navy SBIR 2018.1, Topic N181-079, https://www.navysbir.com/n18_1/N181-079.htm, 2018.

(Attick 2018) Donna Attick, Develop and Apply Artificial Intelligence and Machine Learning Techniques for Next-Generation Mission Planning, Navy SBIR 2018.1, Topic N181-018, https://www.navysbir.com/n18_1/N181-018.htm, 2018.

(JackStewart 2018) Jack Stewart, Tesla's Autopilot Was Involved in Another Deadly Car Crash, Wired, https://www.wired.com/story/tesla-autopilot-self-driving-crash-californa/, Mar. 30, 2018.

(NathanBomey 2018) Nathan Bomey, Uber self-driving car crash: Vehicle detected Arizona pedestrian 6 seconds before accident, USA Today, https://www.usatoday.com/story/money/cars/2018/05/24/uber-self-driving-car-crash-ntsb-investigation/640123002/, May 24, 2018.

(DennisBrown 2016) Dennis E. Brown, Systems and Methods for Artificial Intelligence-Based Gamified Retail Sales Accelerator, US Patent Application US20180174088A1, 2016.

(Peyrelevade 2008) Jerome Peyrelevade, Use of artificial intelligence in providing beauty advice, U.S. Pat. No. 7,437,344 B2, Oct. 14, 2008.

(Hassoun 1995) M. H. Hassoun, Fundamentals of Artificial Neural Networks, MIT Press, 1995.

(Helwig 2017) Nathaniel E. Helwig, Multivariate Linear Regression, University of Minnesota, http://users.stat_umn.edu/~helwig/notes/mvlr-Notes.pdf, 2017.

(WikiNonlinearRegression 2018) Wikipedia, Nonlinear Regression, https://en.wikipedia.org/wiki/Nonlinear_regression, 2018.

(WikiPolynomialRegression 2018) Wikipedia, Polynomial Regression, https://en.wikipedia.org/wiki/Polynomial_regression, 2018.

(WikiLogisticRegression 2018) Wikipedia, Logistic Regression, https://en.wikipedia.org/wiki/Logistic_regression/, 2018.

(WikiMultinomialLogisticRegression 2018) Wikipedia, Multinomial Logistic Regression, https://en.wikipedia.org/wiki/Multinomial_logistic_regression/, 2018.

(WikiOrdinalRegression 2018) Wikipedia, Ordinal Regression, https://en.wikipeia.org/wiki/Ordinal_regression, 2018.

(WikiFFNeuralNet 2018) Wikipedia, Feed-Forward Neural Network, https://en.wikipedia.org/wiki/Feedforward_neural_network/, 2018.

(OceanStudies 2000) Ocean Studies Board, Oceanography and Mine Warfare, https://www.nap.edu/read/9773/chapter/1#ii: National Academy Press, 2000.

(TianWeiYaoping 2016) Z. Tian, Z. Wei, L. Yaoping and P. Xianjun, "Overview on Mission Planning System," *International Journal on Knowledge Engineering*, vol. 2, no. 1, pp. 56-59, March 2016.

(WikiInteriorPoint 2018) Wikipedia, Interior-point method, https://en.wikipedia.org/wiki/Interior-point_method/, 2018.

(WikiNpHard 2018) Wikipedia, NP-hardness, https://en.wikipedia.org/wiki/NP-hardness, 2018.

SUMMARY OF THE INVENTION

This invention presents a framework for utilizing big data analytics to harvest repositories of known good designs for the purpose of aiding engineering product design, mission or retail planning. We also present a querying engine, utilizing an information retrieval framework, capable of providing teams (workforces) with information similar to the ones harvested in a database, for the purpose of improving efficiency and efficacy.

The invention outlines a novel approach for applying artificial intelligence to the training of an engineering design system model, assimilates the definition of meta-data for design containers (binders) to that of labels for books in a library, and represents customers, requirements, components and assemblies in the form of database objects with relational dependence. We evaluate the inputs and outputs of the design process, but treat the process otherwise as a black box. The design information can be harvested, for the purpose of improving design decision fidelity for new designs, by providing such database representation of the design content.

Further, a querying engine (a retrieval model), that operates on the archived design containers, and yields results that are likely to satisfy user queries, is presented. This model, which is based on latent semantic analysis, predicts the degree of relevance between accessible design information and a query, and presents the most relevant previous design information to the user. A few simple examples, including one involving idea generation for conceptual design, are presented, in order to provide insight into the significant utility that may be derived from the retrieval model.

Along these lines, this invention presents the framework in FIG. 1, for utilizing big data analytics to harvest repositories of known good designs for the purpose of assisting with specific areas in engineering product design. While the framework can be applied to product design in general, as well as to mission and retail planning, mechanical product design is here first considered (in FIG. 1). The framework in FIG. 1 for predictive analytics assumes that, during the course of design projects, design information is captured in structured fashion using software such as the Ecosystem (SteingrimssonYi 2017), (Steingrimsson 2014). Project binders from past design projects are then archived in databases and made available to designers working on new design projects. These design containers were referred to as e-design notebooks (SteingrimssonYi 2017), (Steingrimsson 2014). The system is trained so that it can provide the best possible guiding information, such as for new product design, and sanitize the decisions made on the new projects. On the new projects, the system helps identify anomalies (causes of concern), defined in terms of deviations from the guiding reference, and prompt for investigation.

The benefits associated with the big data framework are multifold:

1. By comparing new design content against the guiding designs (reference), the fidelity of decisions related to the new design can be improved, as indicated above.

2. Through deployment of latent semantic analysis, the big data framework can process a variety of user queries, retrieve the most relevant archived information, and present to the user.

A simple example involving idea generation (brainstorming) for Concept Design is presented in order to provide insight into the significant utility that may be derived from the invention. 3. While FIG. 16 and FIG. 18 present a relatively simple example, to convey the concept, more nuanced examples can be crafted around the Detailed Design phase.

Depending on users' needs, the big data framework can query for information related to specific standards, regulations, policies, customer information, internal requirements, best practices, previous solutions, analogies, material properties, common components, etc., retrieve information from the databases yielding the best match, and present to the user.

By harvesting information from past design projects, including designs that eventually have not received selection for implementation, but may still fulfill the design requirements, for the purpose of providing predictions aimed at aiding future design projects, we think we may be taking a step towards a paradigm shift in engineering design. This invention applies predictive analytics to large archives from past design projects, for the purpose of helping designers on future design projects.

This invention presents a similar big data analytics framework for military mission planning. The framework assumes training of an automated mission planning system using requirements, combined with tactical mission plans or asset performance models from past mission planning projects. When applying requirements from a new mission planning project as input, the trained system offers a guiding plan as an aid to mission designers. We show how this guiding plan can leverage and exploit mission performance data and user feedback, including after action reports, planning decisions, and critiques of system performance. Given archived data from past missions involving weapon selection, determination of waypoint, fuel usage calculation, time line development and communication planning, the invention assumes training of machine learning tools, followed by application of corresponding inputs for new missions, for the purpose of generating references decisions aids for the new missions.

Extension to retail planning is also presented.

DESCRIPTION OF THE DRAWINGS

FIG. 15 similarly shows how the Level 1 objects can be represented in relation to corresponding Level 2 objects (together with the requirements that the Level 2 objects address). FIG. 15 further provides an illustration of how component options and risks, for an overall design, can be programmed into databases based on existing engineering knowledge (for example, machine design text awareness of risks for certain components or uses). Analogous to FIG. 12-FIG. 14, this drawing is replicated from (SteingrimssonYi 2017), but with additional context provided.

FIG. 16 also clarifies the context between the querying engine and the predictive analytics framework in FIG. 1.

For the case of surface or underwater mission planning.

DETAILED DESCRIPTION OF THE PREFERRED EMBODIMENTS

1. Definitions

Figure 1:
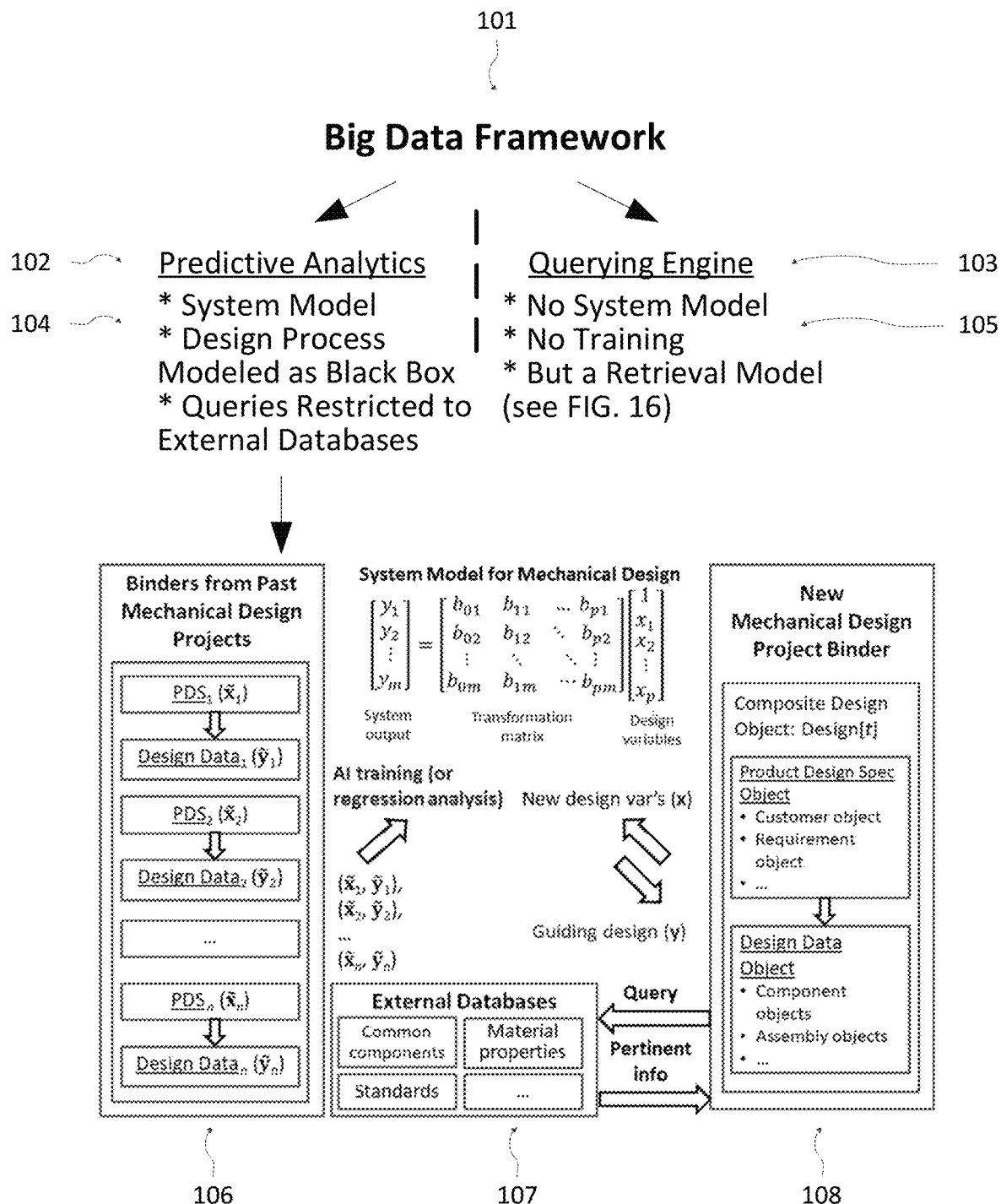
FIG. 1 outlines the framework for applying predictive analytics to specific areas of engineering product design, such as mechanical design. The same framework can be extended to other areas of engineering design. The input requirement vector ("features desired") is expected to stay largely the same, but the composition of the output vector ("features observed") will likely be revised in accordance with the new output.
Figure 2:
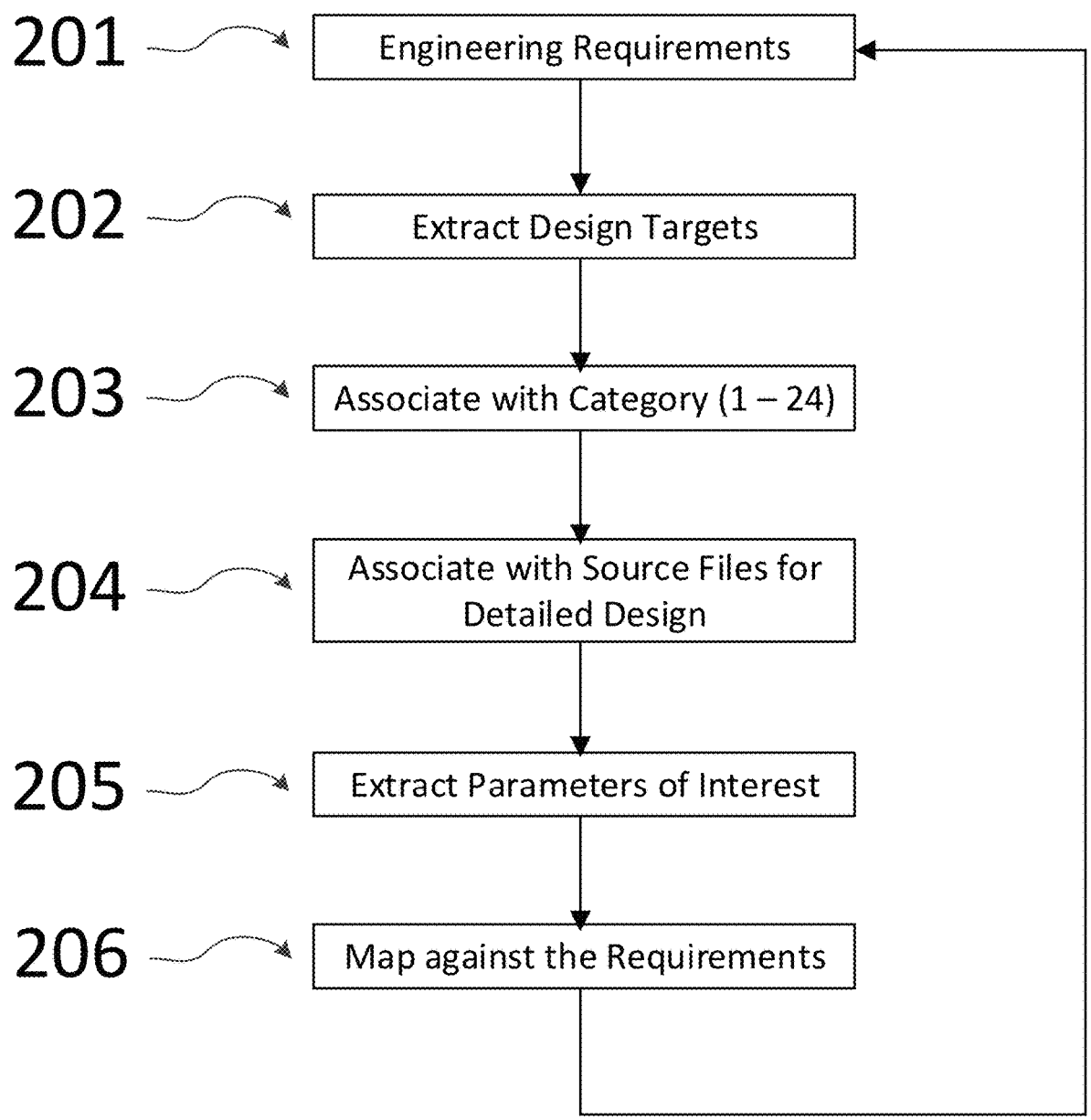
FIG. 2 presents a generic method for associating data files from Detailed Design with the engineering requirements. Such a method is needed, for the purpose of informing the automatic assessment which data files to look at in order to obtain information needed for assessment of given engineering requirements.

Table 2 captures the primary acronyms used in the patent.

TABLE 2

Summary of the primary definitions and acronyms.

| Name | Definition |
| --- | --- |
| AI | Artificial Intelligence |
| CAG | Commander, Air Group |
| CNN | Convolutional Neural Network |
| DCC | Dewey Decimal Classification |
| DL | Deep Learning |
| DOD | Department of Defense |
| FLOP | Floating Point Operation |
| IR | Information Retrieval |
| JMPS | Joint Mission Planning System |
| LIDAR | Light Imaging Detection And Ranging |
| LMS | Lease Mean Square |
| LSA | Latent Semantic Analysis |
| LSI | Latent Semantic Indexing |
| MEDAL | Mine Warfare Environmental Decision Aid Library |
| ML | Machine Learning |
| OEM | Original Equipment Manufacturer |
| PDF | Probability Density Function |
| PDS | Product Design Specification |
| PLM | Product Lifecycle Management |
| SLAM | Simultaneous Localization and Mapping |
| SVD | Singular Value Decomposition |
| SW | Software |

We define artificial intelligence as the use of computers to mimic the cognitive functions of humans. When machines carry out tasks based on algorithms in an "intelligent" manner, that is AI. Artificial intelligence is a broader concept than machine learning (DataScienceCentral 2018).

We define machine learning as a subset of AI that focuses on the ability of machines to receive a set of data and learn for themselves, and change algorithms as they learn more about the information that they are processing (DataScienceCentral 2018).

We refer to deep learning as a subset of machine learning. We define deep learning in terms of "deep neural networks", i.e., neural networks comprising of two or more layers. Deep learning networks need to see large quantities of items in order to be trained (DataScienceCentral 2018).

We define a "known, good design" as a design that has satisfied all the requirements. This is a design that has the requirement vector fully specified, and where the design produced (the output vector) fulfills the design requirements.

Supervised learning is a data mining task that involves inference of a function from labeled training data.

Unsupervised learning is a type of machine learning algorithm used to draw inferences from datasets consisting of input data without labeled responses.

Reinforcement learning is an area of machine learning concerned with how software agents ought to take actions in an environment so as to maximize some notion of cumulative reward.

2. Best Mode of the Invention

FIG. 1, FIG. 14, FIG. 15, FIG. 16, FIG. 19, FIG. 21 and FIG. 23 capture the best mode contemplated by the inventors, according to the concepts of the present invention.

3. The Generic System Model Assumed

We assume a generic system model:

$$\tilde{y} = f(\tilde{x}). \tag{1}$$

The input vector, $\tilde{x}$, could be considered as consisting of design variables (design targets or requirements). The transformation, $f(\ )$ could be a non-linear function of the input, $\tilde{x}$. Engineers transfer the requirements, $\tilde{x}$, into the product, $\tilde{y}$, through the transformation. The transformation, $f(\ )$ may contain reasoning and knowledge on how to make $\tilde{y}$ (on how to design or produce $\tilde{y}$). To other extent, we treat the making of $\tilde{y}$ from $\tilde{x}$ as a black box. In the case of the design process, the transformation, $f(\ )$, may consist of customers, requirements, systems and assembly. We present artificial intelligence and supervised learning as one of the options to train the system, as explained below.

The input vector, $\tilde{x}$, could capture design criteria, such as the desired weight, width, height and length of an automotive part (the "intended features"). The elements of the product vector, $\tilde{y}$, could capture performance of the finalized part, or even ideas or options relevant to specific design stages (the "observed features"). The elements of $\tilde{x}$, and even $\tilde{y}$, could be derived from the 24 categories listed in Table 1.

For clarification, refer to the examples below. It is assumed that the organization adopting the invention has practiced structured capture of the binders ($\tilde{x}$, $\tilde{y}$) from past projects, for example in SW like the Ecosystem (SteingrimssonYi 2017), (Steingrimsson 2014). The binders from the past projects may, for example, have been archived in an internal database.

This invention offers a scalable solution, depending on the size of the input data. In the case of small (design) databases, we present regression as a suitable tool for determining the system model. For large (design) databases, say, hundreds, thousands or millions of ($\tilde{x}$, $\tilde{y}$) duplets, we present neural networks as a suitable tool for determining the system model.

3.1 Multivariate Linear Regression

In case of archived binders of relatively small-to-modest size, or even of moderately large size, we recommend applying a multivariate (multiple) linear regression model: Drawing upon FIG. 1, we model the archived binders, in this case, as $$\tilde{y}_{ik} = b_{0k} + \Sigma_{j=1}^{p} b_{jk} \tilde{x}_{ij} + e_{ij} \quad (2)$$

for $i \in \{1, \ldots, n\}$ and $k \in \{1, \ldots, m\}$. Here, $\tilde{y}_{ik} \in R$ is the k-th real-valued response for the i-th observation.

$b_{0k} \in R$ is the regression intercept for k-th response.

$b_{jk} \in R$ is the j-th predictor's regression slope for k-th response.

$(e_{i1}, \ldots, e_{im}) \sim N(0_m, \Sigma)$ is a multivariate Gaussian error vector.

The archived binders can be stacked up into a matrix and represented as $$\begin{bmatrix} \tilde{y}_{11} & \cdots & \tilde{y}_{1m} \\ \tilde{y}_{21} & \cdots & \tilde{y}_{2m} \\ \tilde{y}_{31} & \cdots & \tilde{y}_{3m} \\ \vdots & \ddots & \vdots \\ \tilde{y}_{n1} & \cdots & \tilde{y}_{nm} \end{bmatrix} = \begin{bmatrix} 1 & \tilde{x}_{11} & \tilde{x}_{12} & \cdots & \tilde{x}_{1p} \\ 1 & \tilde{x}_{21} & \tilde{x}_{22} & \cdots & \tilde{x}_{2p} \\ 1 & \tilde{x}_{31} & \tilde{x}_{32} & \cdots & \tilde{x}_{3p} \\ 1 & \vdots & \vdots & \ddots & \vdots \\ 1 & \tilde{x}_{n1} & \tilde{x}_{n2} & \cdots & \tilde{x}_{np} \end{bmatrix} \begin{bmatrix} b_{01} & \cdots & b_{0m} \\ b_{11} & \cdots & b_{1m} \\ b_{21} & \cdots & b_{2m} \\ \vdots & \ddots & \vdots \\ b_{p1} & \cdots & b_{pm} \end{bmatrix} + \quad (3)$$

$$\begin{bmatrix} e_{11} & \cdots & e_{1m} \\ e_{21} & \cdots & e_{2m} \\ e_{31} & \cdots & e_{3m} \\ \vdots & \ddots & \vdots \\ e_{n1} & \cdots & e_{nm} \end{bmatrix}$$

$$\tilde{Y} = \tilde{X}B + E. \quad (4)$$

The ordinary least squares problem is $$\min_{B \in R^{(p+1) \times m}} \|\tilde{Y} - \tilde{X}B\|^2 \quad (5)$$

where $\|\cdot\|$ denotes the Frobenius norm (Helwig 2017).

The ordinary least squares problem has a solution of the form (Helwig 2017)

$$\hat{B} = (\tilde{X}^T \tilde{X})^{-1} \tilde{X}^T \tilde{Y} \quad (6)$$

A new project will give rise to the input vector x from which the guiding reference y is obtained as $$y = \hat{B}^T x. \quad (7)$$

Note that the multivariate regression offers a deterministic solution (no convergence problems).

3.2 Other Regression Analyses Available

While multivariate linear regression may be a natural choice, in case regression analysis is preferred for determining the system model, in particular for continuous and real-valued inputs, there are other options available. These include:

1. Polynomial regression (WikiPolynomialRegression 2018).
2. Logistic regression (WikiLogisticRegression 2018).
3. Multinomial logistic regression (WikiMultinomialLogisticRegression 2018).
4. Ordinal regression (WikiOrdinalRegression 2018).
5. Other types of nonlinear regression (PennState 2018), (WikiNonlinearRegression 2018).

3.3 AI Predictor (Neural Network)

Neural networks are typically preferred over linear regression in cases when the input data size is very large. Neural networks may be used for image classification, for example to detect an event or artifact in a sample of images, each of which may contain approx. $10^6$ pixels, each with, say, 64 color values. Neural networks are similarly suitable for identification of events in sampled audio, where the input may occupy gigantic space of time and frequency. Neural networks may be preferred, in the case of a very large set of archived binders.

Neural networks currently used in machine learning include Feed-Forward Neural Networks, Radial Basis Function Neural Networks, Kohonen Self-Organizing Neural Networks, Recurrent Neural Networks, Convolutional Neural Networks and Modular Neural Networks. Other neural networks supported by this invention include Deep Feed Forward Networks, Long/Short Term Memory, Gated Recurrent Units, Auto Encoders, Variational Auto Encoders, Denoising Auto Encoders, Sparse Auto Encoders, Markov Chains, Hopfield Networks, Boltzmann Machines, Restricted Boltzmann Machines, Deep Belief Networks, Deep Convolutional Networks, Deconvolutional Networks, Deep Convolutional Inverse Graphics Networks, Generative Adversial Networks, Liquid State Machines, Extreme Learning Machines, Echo State Networks, Deep Residual Networks, Kohonen Networks, Support Vector Machines and Neural Turing Machines.

Even so, the main emphasis here is on Single and Two-Layer Feed-Forward Neural Networks. We show how Two-Layer Feed-Forward Neural Networks can approximate any system model.

For simplicity, it is assumed that input parameters take on values from a continuous range.

1. Single-Layer Feed-Forward Neural Network

In a feed-forward neural network, the connections between the nodes do not form a cycle. The simplest kind of neural network is a single-layer perceptron network, which consists of a single layer of output nodes; the inputs are fed directly to the outputs via a series of weights. The sum of the products of the weights and the inputs is calculated in each node, and if the value is above a given threshold (typically 0) the neuron fires and takes on the activated value (typically 1). Otherwise, it takes on the deactivated value (typically −1). Perceptrons can be trained by a simple learning algorithm that is usually referred to as the Delta Rule (see (16)). It calculates the errors between calculated output and sample output data, and uses this to create an adjustment to the weights, thus implementing a form of gradient descent. Single-layer perceptrons are only capable of learning linearly separable patterns.

A common choice for the activation function is the sigmoid (logistic) function:

$$f(z) = \frac{1}{1 + e^{-z}}. \quad (8)$$

Figure 3:
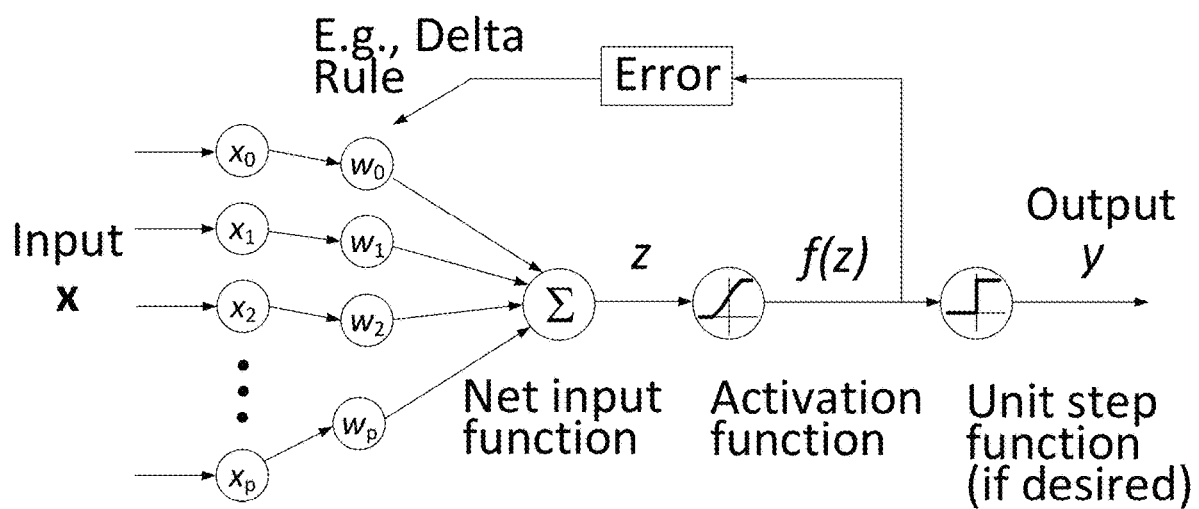
FIG. 3 presents the schematics of a logistic regression classifier in the form of a single-layer feed-forward neural network.

With this choice, the single-layer network shown in FIG. 3 is identical to logistic regression.

A single-layer neural network has guaranteed convergence (equivalent to regression).

2. Multi-Layer Feed-Forward Neural Network

It may be recognized that a straight forward application of a single-layer neural network model cannot accommodate all requirements. To handle binary requirements (simple presence or absence), XOR-like conditions, or categorical requirements, a two-layer neural network may be necessary (Duda 2001).

Figure 5:
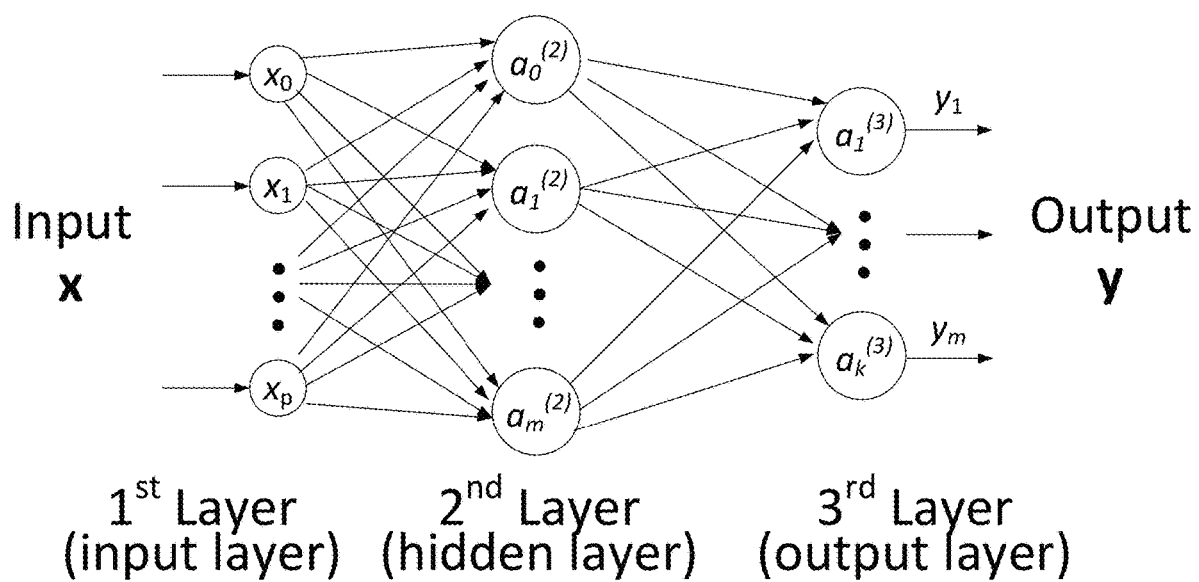
FIG. 5 presents schematics of a multi-layer perceptron network.

A multi-layer feed-forward neural network, shown in FIG. 5, consists of multiple layers of computational units, interconnected in a feed-forward fashion. Each neuron in one layer has directed connections to the neurons of the subsequent layer. In many applications the units of these networks apply the sigmoid function (8) as the activation function (WikiFFNeuralNet 2018). Similar to the single-layer case, the activation is defined as $$a_j^i = f(\Sigma_k w_{ik} x_{ik} x_{kj} + b_i). \qquad (9)$$

Convergence of a multi-layer neural network involves non-convex optimization, and hence is not guaranteed. You can get stuck in local minima.

Figure 4:
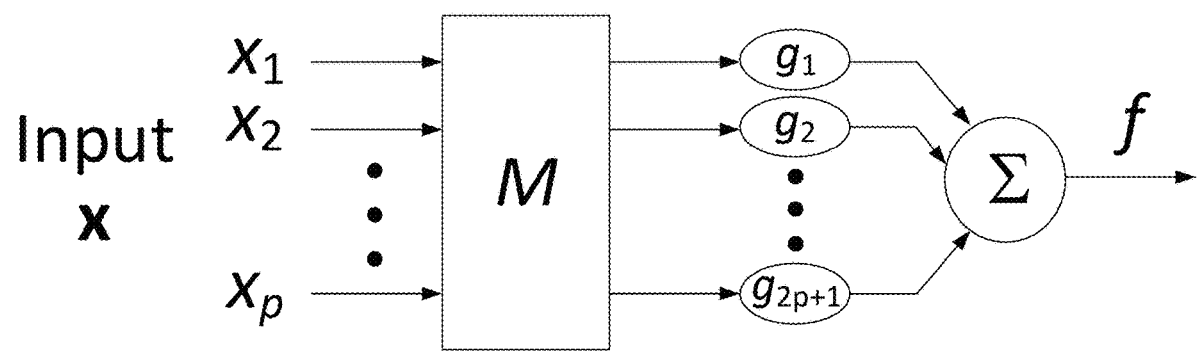
FIG. 4 offers a neural network representation of Kolmogorov's theorem. A universal transformation M maps R, into several uni-dimensional transformations (Hassoun 1995). We draw upon Kolmogorov's theorem to illustrate generality of our system model. Kolmogorov's theorem provides theoretical foundation for the capabilities of two-layer feed-forward neural network in terms of approximating any continuous function.

3.4 Approximation Capabilities of Feed-Forward Neural Networks for Continuous Functions According to Kolmogorov, any continuous, real-valued function can be modeled in the form of a two-layer neural network. More specifically, Kolmogorov showed in 1957 that any continuous real-valued function $f(x_1, x_2, \ldots, x_n)$ defined on $[0,1]n$, with $n \geq 2$, can be represented in the form $$y = f(x_1, x_2, \ldots, x_n) = \Sigma_{j=1}^{2n+1} g_j(\Sigma_{i=1}^n \phi_{ij}(x_i)) \qquad (10)$$

where the $g_j$'s are properly chosen functions of one variable, and the $\phi_{ij}$'s are continuously monotonically increasing functions independent of $f$. FIG. 4 offers a neural network representation of Kolmogorov's theorem (Hassoun 1995).

While users are welcome to use neural networks of three or more layers, we recommend limiting the networks to two layers, for complexity sake. Yet, even with two layers, this invention can approximate a generic system model, per Kolmogorov's theorem.

3.5 Multivariate Linear Regression when the Input Requirements Defined in Terms of Ranges When one or more of the inputs is limited to a single, continuous range $$x_j \in [x_{j,min}, x_{j,max}] \qquad (11)$$

the multivariate linear regression problem can be formulated as $$\min_{\substack{B \in R^{(p+1) \times m} \\ \tilde{X} \in Conv(P) \subseteq R^{(p+1)}}} \|\tilde{Y} - \tilde{X}B\|^2. \qquad (12)$$

Here, $Conv(P) \subseteq R^{(p+1)}$ is the convex hull defined by the $(p+1)$ elements comprising the vector $\tilde{X}$.

Figure 6A:
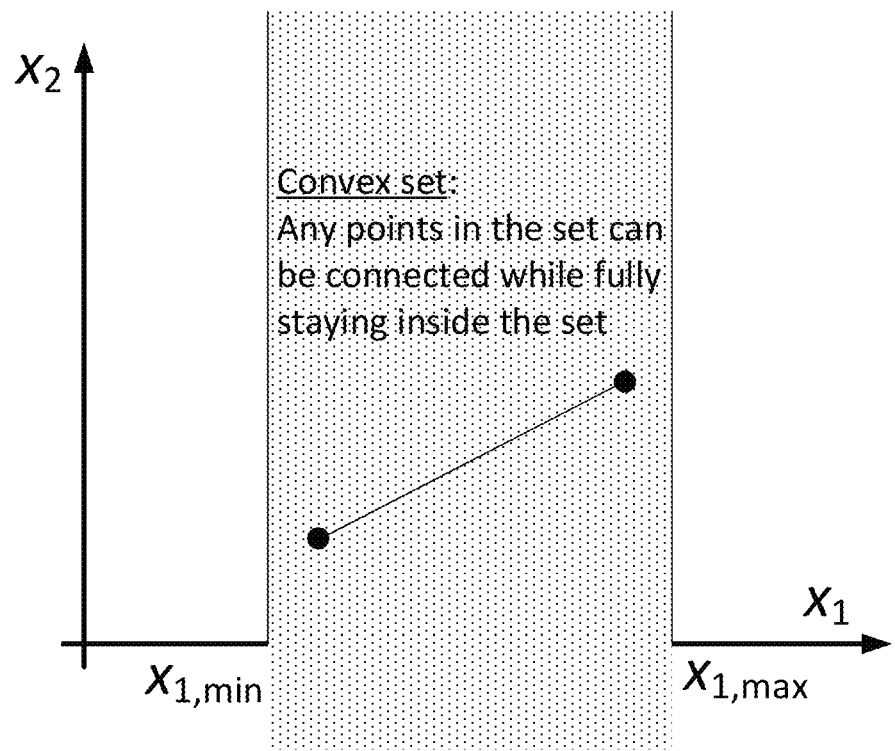
FIG. 6*a* and FIG. 6*b* provide visualization of the convex nature of the multivariate linear regression problem, for deriving the system model, when one or more input requirements are limited to a single continuous range (a range limited by a minimum and a maximum value).
Figure 6B:
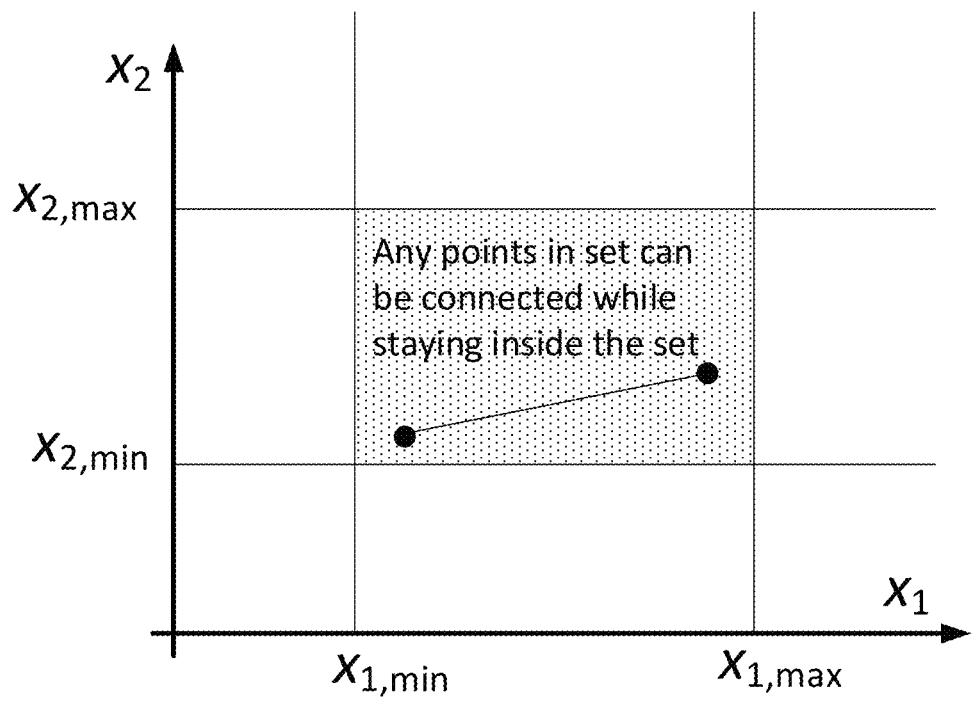

It is important to recognize that when any given element of the input vector $\tilde{X}$ is confined to a single, continuous range, the resulting vector subset forms a convex polytope in $R^{(p+1)}$. FIG. 6 illustrates, for a simple case, that you can travel between any given points in the polytope, and yet stay within the set.

While the optimization problem in (12) may not have a closed-form solution, the fact that it is convex means that you can generate a solution using efficient interior-point solvers, with polynomial worst-case complexity (WikiInteriorPoint 2018):

$$O((p+1)^{3.5}). \qquad (13)$$

3.6 Assigning Importance Levels (Priorities) to Specific Requirements

The optimization problem in (12) can be extended not only to support ranges, but also priorities assigned to specific requirements:

$$\min_{\substack{B \in R^{(p+1) \times m} \\ \tilde{X} \in Conv(P) \subseteq R^{(p+1)}}} \|\tilde{Y} - \tilde{X}\tilde{W}B\|^2. \qquad (14)$$

Here $\tilde{W}$ is a $p \times p$ diagonal matrix with element $w_{jj}$ specifying the priority associated with input requirement $j$, $x_j$. The requirements with higher priority receive higher weight. The optimization problem is still linear and convex.

3.7 Sensitivity Analysis

In case it is of interest, the interior-point methods, that can be used to solve the optimization problems in (12) and (14), can also inform the designers of the relative contributions of given input requirements to the objective function. The sensitivity to a given input requirement is defined as the derivative of the objective function with respect to that requirement. The sensitivities come about as Lagrange multipliers that are produced as a by-product from the interior-point solvers. While you already may be hitting a boundary, the derivatives may inform designers about variables that still can change within the feasible set.

3.8 Input Requirements Defined in Terms of Categories

Once an input requirement consists of categories, the optimization problem automatically becomes NP-hard, meaning the run time of a solver is no longer guaranteed to be deterministically polynomial in the size of the problem. For categorical (discrete) input, there may be cases that can be solved quickly. But in general the problem may be subjected to exponential worst-case complexity (WikiNpHard 2018).

4. The Generic Processes Assumed

4.1 Design Process

It is assumed that a classical design process consists of the following stages:

Requirement Gathering→Concept Design→Detailed Design→Final Design.

Such process is modeled in the Ecosystem SW (SteingrimssonYi 2017), (Steingrimsson 2014). The customers, customer requirements and corresponding engineering requirements are defined, as a part of the Requirement Gathering, and captured in the Product Design Specification. The Concept Design consists of brainstorming, concept design analysis (scoring) and design selection. The Detailed Design may capture detailed analysis of both the overall system and associated subsystems. Final Design is usually preparation for prototype building or production, and may include steps such as testing and requirement validation (SteingrimssonYi 2017), (Steingrimsson 2014).

4.2 Strike Mission Planning Process

1. Similarities with the Design Process

Mission and strike planning are complex processes, integrating specific performance characteristics for each platform into a comprehensive mission.

Figure 7:
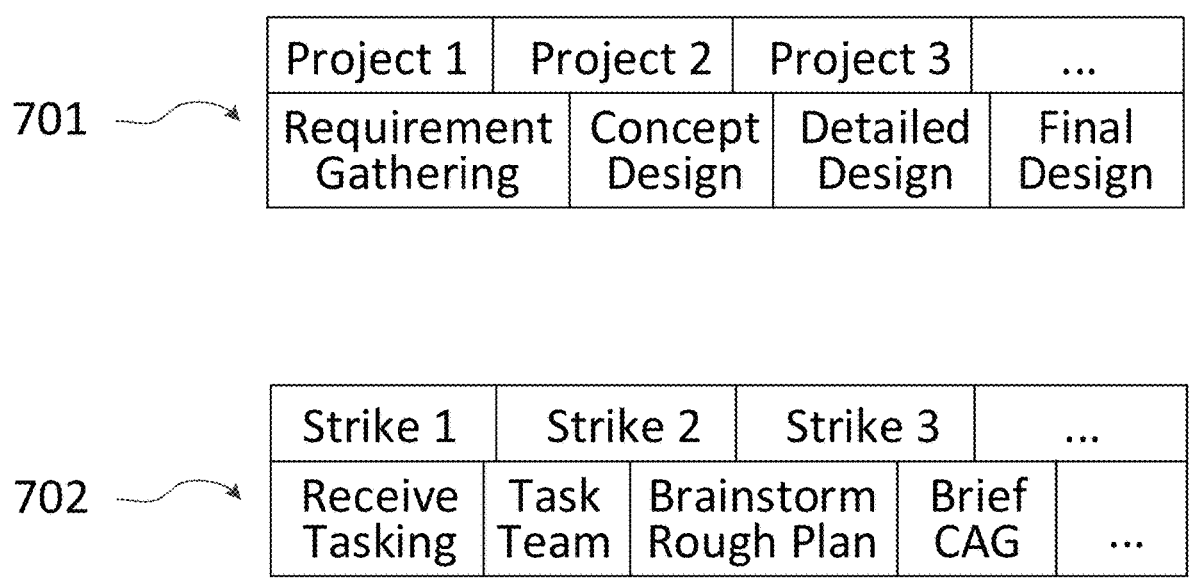
FIG. 7 highlights parallels between the strike mission planning process and the design process. The user interface for multi-strike mission planning system may be crafted through minor modification of the Ecosystem interface for engineering design.

As FIG. 7, Table 3 and Table 4 illustrate, the Navy's tactical aircraft strike planning process provides high degree of resemblance with the engineering design process presented in (Steingrimsson 2014) and (SteingrimssonYi 2017). Hence, the Ecosystem interface of (Steingrimsson 2014) and (SteingrimssonYi 2017) can be applied to the strike planning process, with relatively modest alterations.

TABLE 3

Similarities between the design process and the mission strike planning process.

| Design Process | Strike Planning Cycle |
| --- | --- |
| Requirement Gathering | 1. Receive tasking |
|  | 2. Task strike teams |
| Concept Design | 3. Brainstorm rough plan |
|  | 4. Brief CAG |
| Detailed Design | 5. Create detailed plan |
|  | 6. Conduct briefings |
| Final Design | 7. Execute the mission |
|  | 8. Gather bomb damage assessment |

TABLE 4

Similarities between the Ecosystem software for engineering design and the Navy strike mission planning.

| Ecosystem | Navy Strike Mission Planning |
| --- | --- |
| Design process | Tactical air craft strike planning process |
| Design decision | Planning decision |
| Design project | Combat search & rescue mission |
| Requirement gathering | Mission planning |
| Project sponsor | National Command Authority, Joint Chiefs of Staff, Commanders in Chief (CAG) |
| Supervisor or instructor | Strike leader |
| Design team formation | Strike team formation |
| Ecosystem: High-level SW for design process | JMPS: High-level SW for joint planning | planning

2. Differences

1. The typical Military Personnel Center conducts mission planning from start to finish in an approx. 8 hour window, whereas engineering design projects are usually completed over a period of consisting of a few to several months or even years.
2. In combat, the crew that plans is typically not the crew that flies it, so decisions are sometimes made to enable as much flexibility as possible.
3. In combat, the crew that plans is typically NOT the crew that executes it, so decisions are sometimes made to enable as much flexibility as possible and delegate the decision authority to the lowest possible level (i.e. the person in the cockpit in the mission).
4. In significant contrast to the goal of a design process, the end result of a mission is usually fairly different from the way it was envisioned in the plan. This is due to the fact that the enemy has a vote in how the fight takes place, and you are dealing with severely imperfect assumptions that affect the battle space. The input assumptions may be subjected to considerable time dependence.

4.3 Surface and Underwater Mission Planning

1. Similarities with the Design Process

Figure 8:
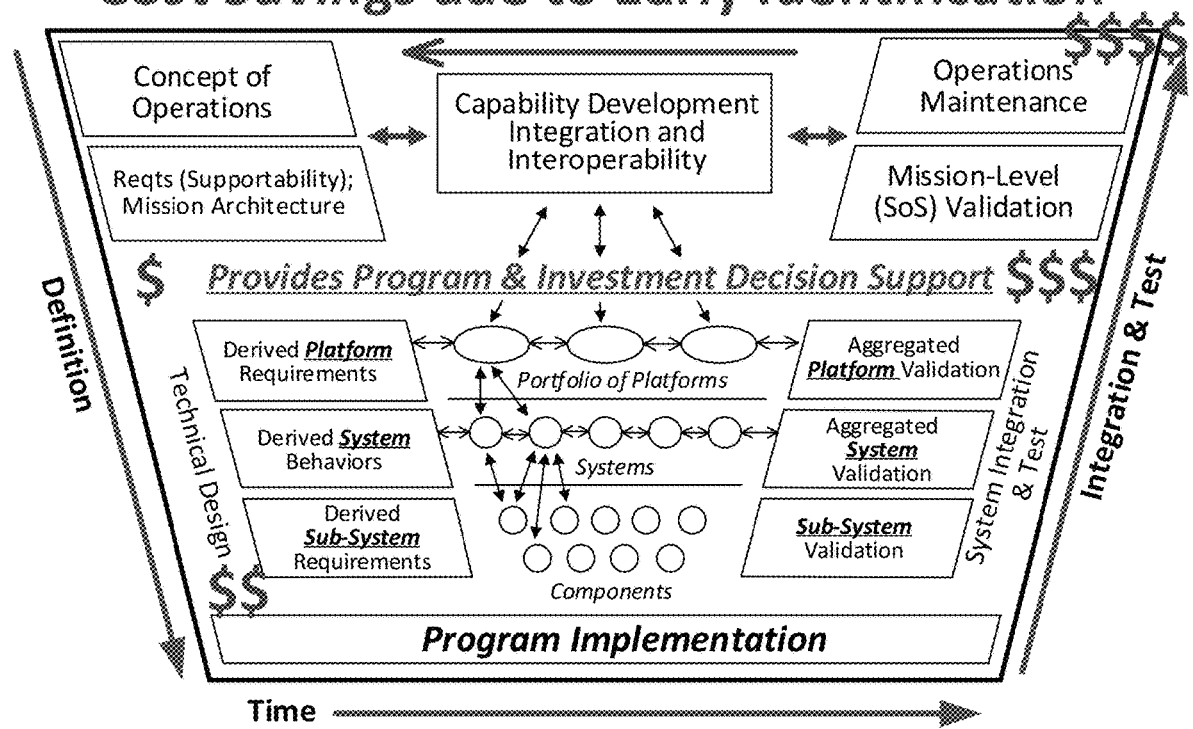
FIG. 8 highlights the cost savings that can be derived from early identification of design oversights, in the context of the V-model for system engineering.
Figure 9:
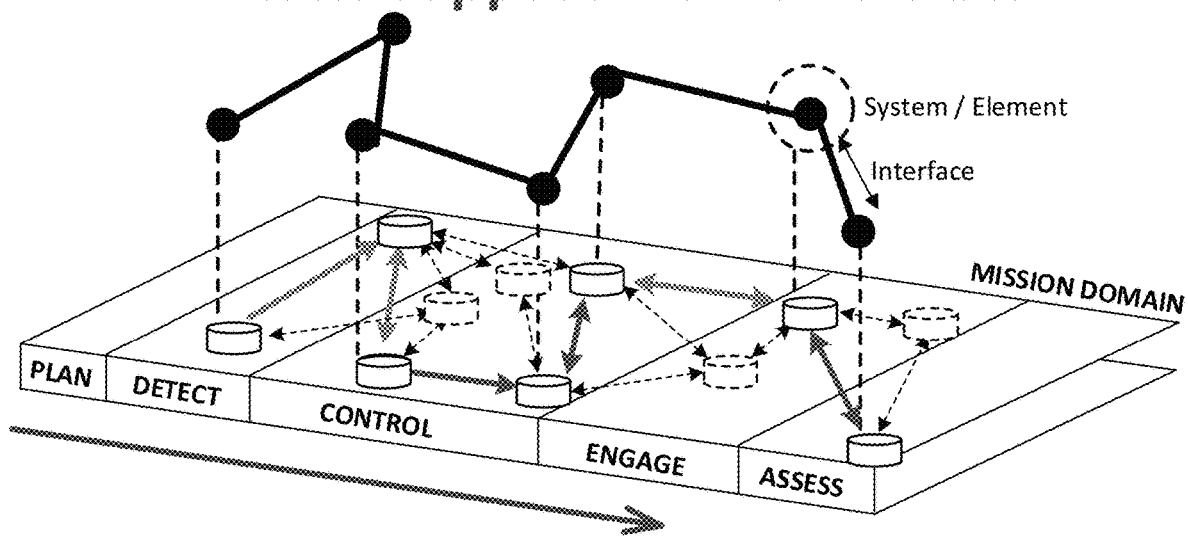
FIG. 9 illustrates how the Ecosystem design framework can provide decision support across mission domains.

The Ecosystem supports the "V" model of system engineering, shown in FIG. 8, and aligns with Navy's thrust in the area of Surface Warfare Mission Engineering and Analysis. In addition to providing decision support for all phases in the design process, FIG. 9 and Table 5 show how the Ecosystem can also support each of the Navy mission domains.

TABLE 5

Similarities between the design process and the Navy mission domains.

| Design Process | Navy Mission Domain |
| --- | --- |
| Requirement Gathering | Plan |
| Concept Design | Detect |
| Detailed Design | Control |
| Final Design | Engage |
|  | Assess |

2. Differences

1. Just as in the case of the strike mission planning process, a Military Personnel Center may conduct mission planning from start to finish in an approx. 8 hour window, whereas engineering design projects may be completed over a period of consisting of a few to several months or even years.
2. Furthermore, in combat, the personnel that plans is typically not the personnel that executes the mission, so decisions are often made with flexibility in mind.
3. In severe contrast to the goal of a design process, the end result of a mission may differ significantly from the way it was envisioned in the plan. This is due to the fact that the enemy has a vote in how a fight takes place, and you may be dealing with imperfect assumptions that affect the battle space.
4. Tactics may need to be adapted to account for changes in environmental conditions.

4.4 Retail Planning Process

Figure 10:
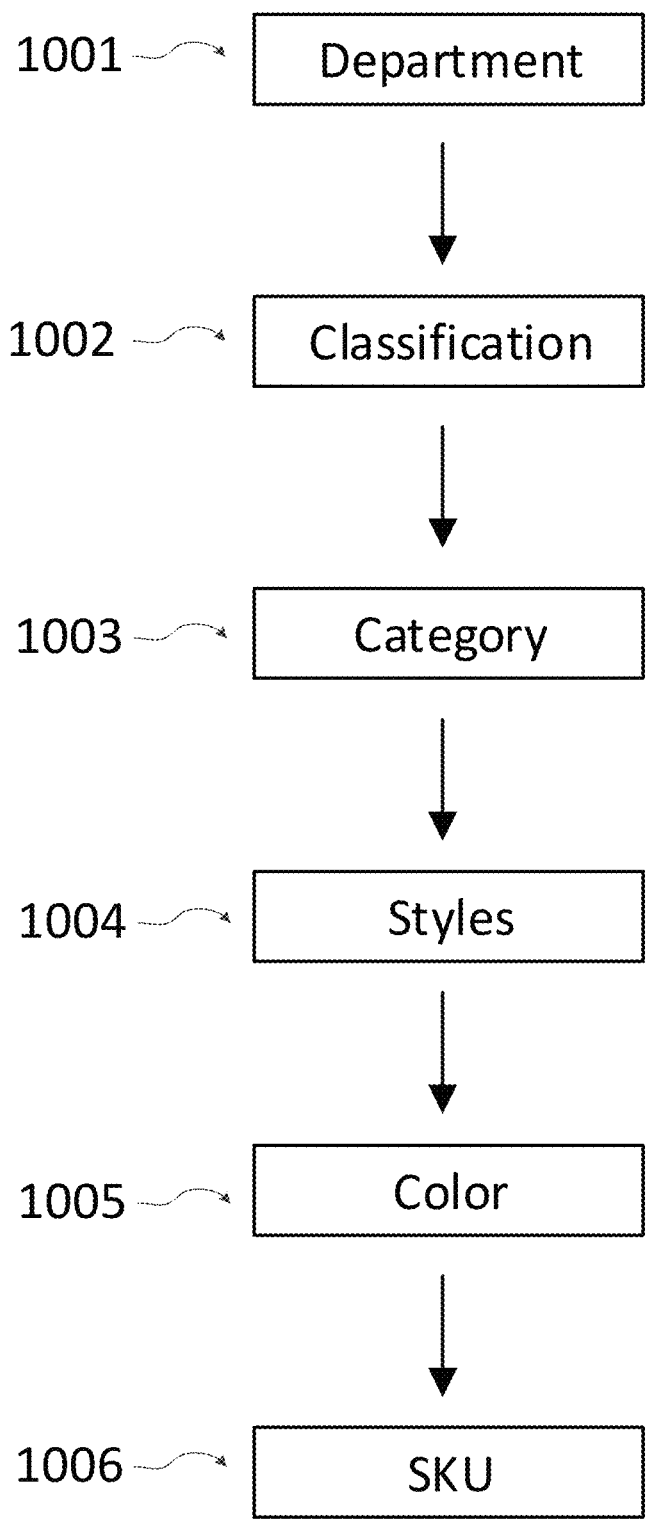
FIG. 10 presents key elements from a generic retail management process.
Figure 11:
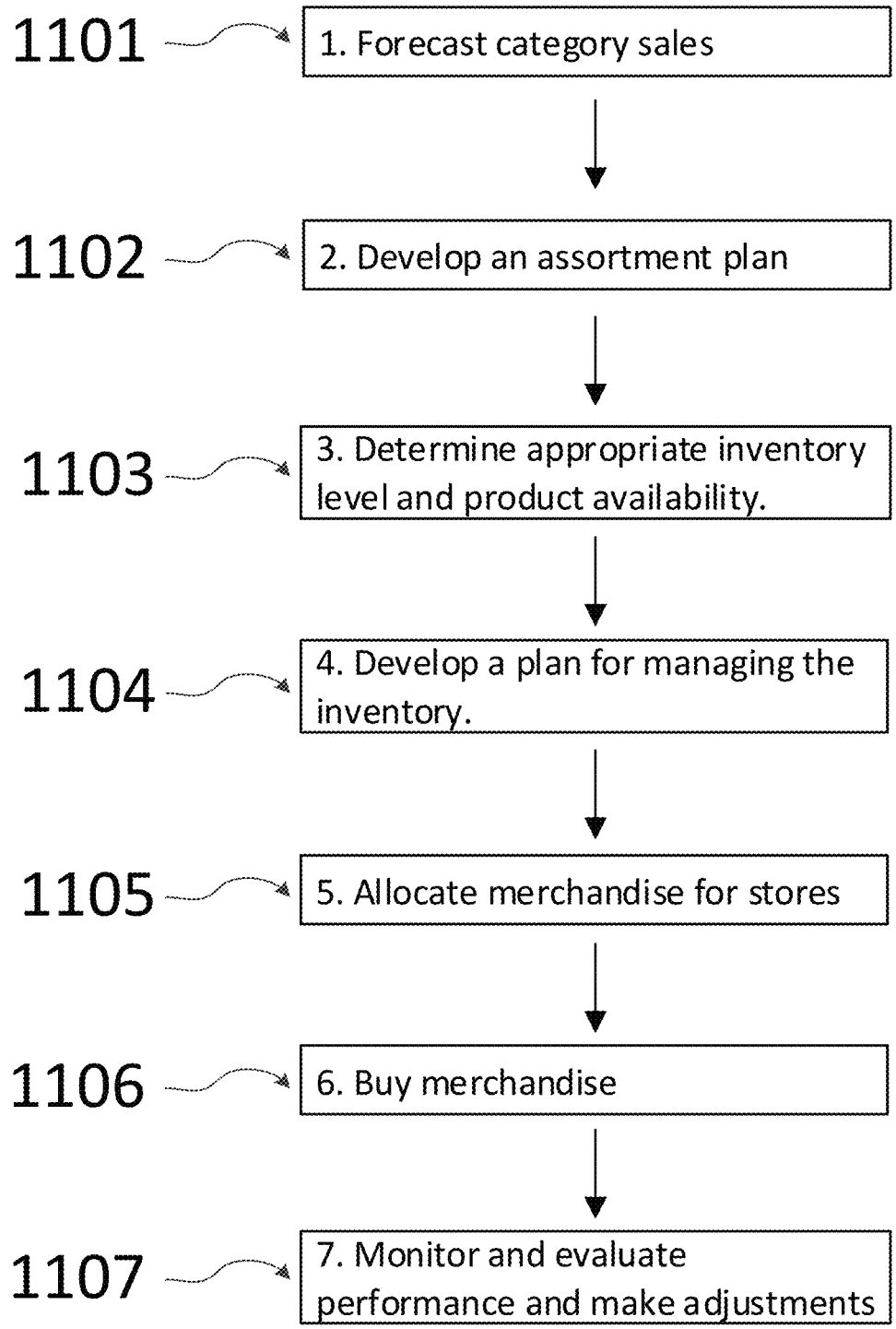
FIG. 11 presents further specifics for a generic inventory management system. The big data framework can help with the forecasting of category sales (Step 1).

FIG. 10 and FIG. 11 summarize a retail planning process. Table 6 presents a mapping between the retail planning processing and the design process.

TABLE 6

Mapping between the design process and the retail planning process.

| Design Process | | Retail Planning Process |
| --- | --- | --- |
| Requirement Gathering | 1. | Forecast category sales |
|  | 2. | Develop an assortment plan |
| Concept Design | 3. | Determine appropriate inventory levels and product availability |
|  | 4. | Develop a plan for managing the inventory |
| Detailed Design | 5. | Allocate merchandise for the stores |
|  | 6. | Buy merchandise |
| Final Design | 7. | Monitor and evaluate performance and make adjustments |

We apply the big data framework to the retail planning process by harvesting analogies from Table 6, in a similar fashion as we harvested analogies from Table 3 and Table 5, in order to extend the big data framework from the design process to the mission planning process. To this effect, we define the input and output vectors as follow:

$$x=[\text{Forecasted\_sale\_category1\_store1}, \\ \text{Forecasted\_sale\_category2\_store1}, \ldots, \text{Forecasted\_sale\_category1\_store2}, \\ \text{Forecasted\_sale\_category2\_store2}, \ldots, \text{Forecasted\_sale\_category1\_store3}, \\ \text{Forecasted\_sale\_category2\_store3}, \ldots] \quad (15)$$

$$y=[\text{Observed\_sale\_category1\_store1}, \text{Observed\_sale\_category2\_store1}, \ldots, \text{Observed\_sale\_category1\_store2}, \\ \text{Observed\_sale\_category2\_store2}, \ldots, \text{Observed\_sale\_category1\_store3}, \\ \text{Observed\_sale\_category2\_store3}, \ldots] \quad (16)$$

6. How to Make the Invention

6.1 Archived Binders

The archived project binders in FIG. 1, FIG. 19, FIG. 21 and FIG. 23 consist of past project binders, and are taken to represent known good designs, known good mission plans, or known good retail plans (projects with all requirements fulfilled). The input vector, $\tilde{x}$, in the ($\tilde{x}$, $\tilde{y}$) duplet could capture design criteria, such as the desired weight, width, height and length of an automotive part (the "intended features"). The elements of the product vector, $\tilde{y}$, could capture performance of the finalized part, or even ideas or options relevant to specific design stages (the "observed features"), as noted above. The duplets are used to train a generic system model, per (3) and (4).

While the composition of the ($\tilde{x}$, $\tilde{y}$) duplets varies between applications, $\tilde{x}$, typically represents some type of 'input', in the case of an engineering application the complete 'requirement list', but $\tilde{y}$ the 'output' of a 'design' or a 'plan'. In the case of mechanical design, $\tilde{y}$ could represent a complete parameterized list of the overall assembly from the solid modeling tool of choice. $\tilde{y}$ could also contain information related to bill of materials or drawings.

The project binders may contain pointers to pertinent content, based on designer inputs and available information. The input format captures and preserves content and associates with the relevant context. This facilitates storage for future use. Pertinent third-party data is accessed from databases with available context provided. The databases may be owned by the vendor of the SW design tool used, by a customer or by a third party. Designers ultimately choose to consider the information that is most relevant for any given design decision. This arrangement allows designers to leverage digital content management to make more informed design decisions without losing focus of the primary design challenge.

The information developed for the project binders in FIG. 1 consists of pointers to the PDS and design (database) objects. The PDS comprises of requirement objects, in programming context, and the design objects are comprised of component and assembly objects. Both can have hierarchy imposed. The design data itself is stored in mass outside the application.

6.2 New Predictions

For new designs, designers could extract the design vector, x, in FIG. 1 from the new requirements, apply to the system model, and get the guiding design, y, as an output. The guiding design, y, could be a reference (starting point) for design of the new product. Such reference may help improve the fidelity of design decisions. If design decisions cause the product to deviate significantly from the reference, y, explanations are likely warranted.

Figure 20:
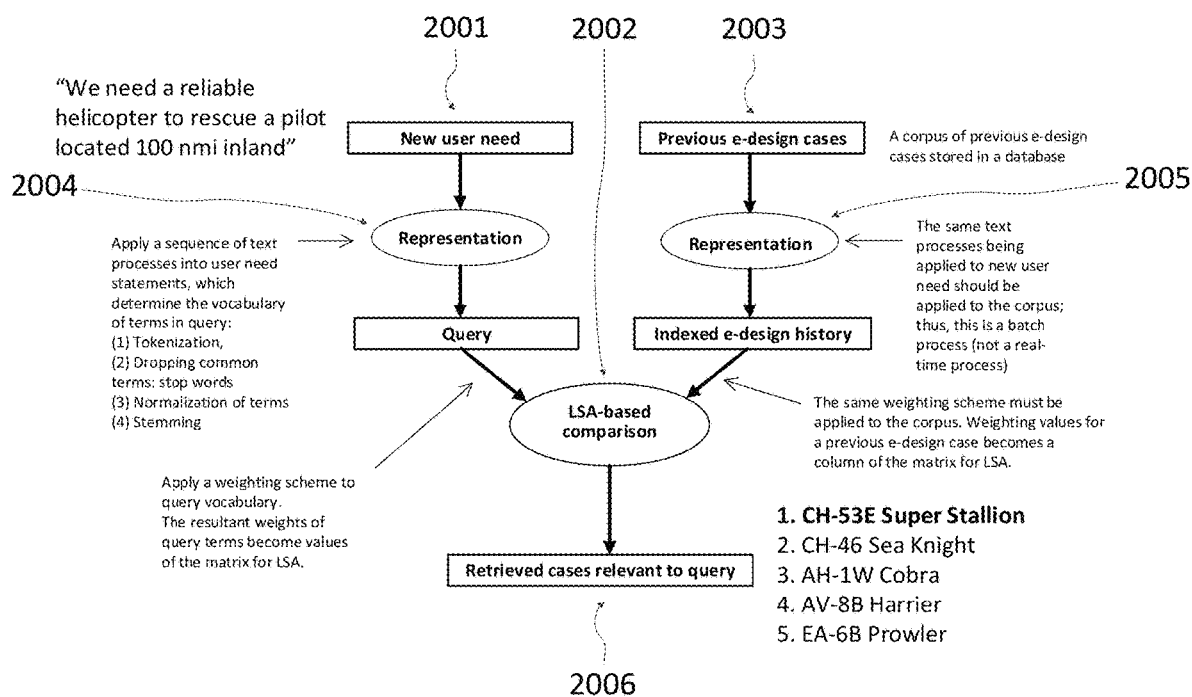
FIG. 20 presents detailed explanations related to application of the process of retrieving previous e-design history relevant to an input query from an aerial strike mission planner (an input query associated with FIG. 19).
Figure 21:
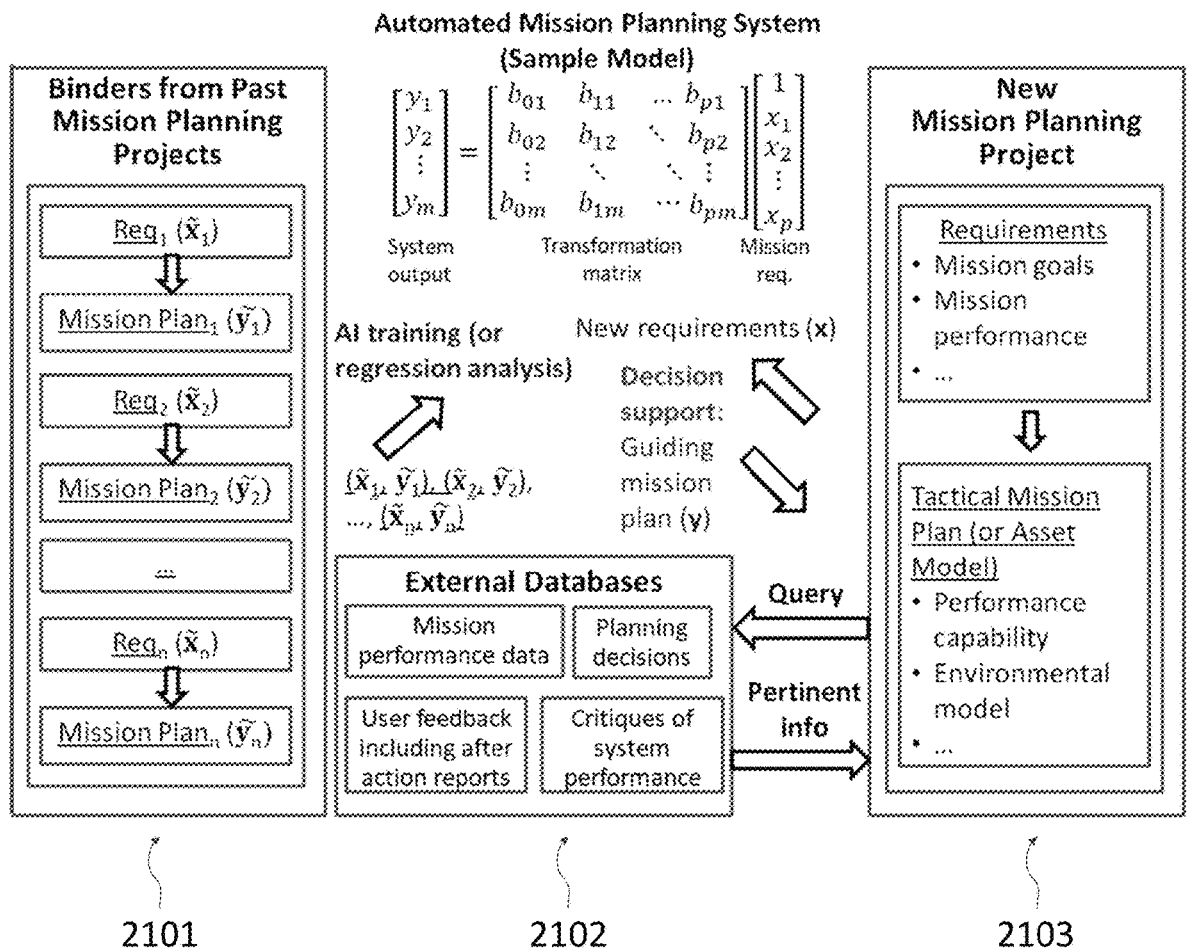
FIG. 21 describes application of the framework for predictive analytics to automated surface or underwater mission planning.
Figure 22:
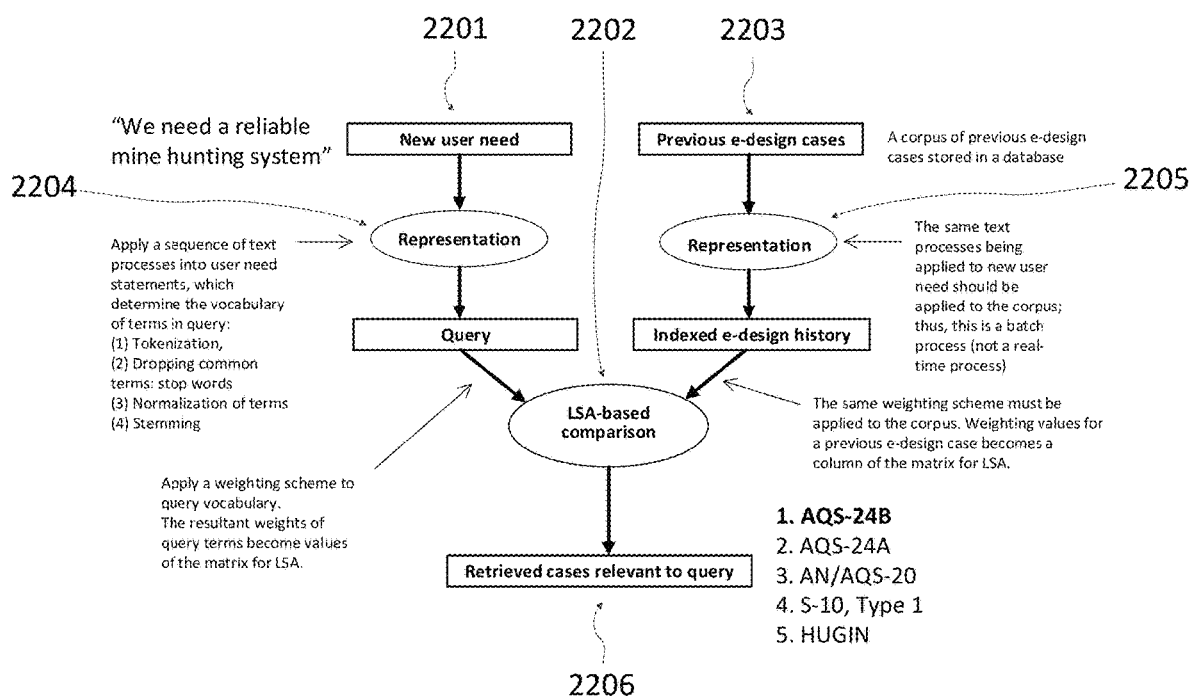
FIG. 22 presents detailed explanations related to application of the process of retrieving previous e-design history relevant to an input query from a surface or underwater mission planner (an input query associated with FIG. 21).

Similarly, this invention assumes training of an automated mission planning system using requirements, combined with tactical mission plans or asset performance models from past mission planning projects, as shown in FIG. 20 and FIG. 22. When applying requirements from a new mission planning project as input, the trained system offers a guiding plan as an aid to mission designers. This guiding plan can leverage and exploit mission performance data and user feedback, including after action reports, planning decisions, and critiques of system performance.

When designing something specific, like a bolt, one expects narrowly defined requirements and relatively good prediction capabilities. As the system model captures a broader subject, one expects more variations in the model, and worse prediction capability.

6.3 Identification of Anomalies

Identification of anomalies (significant deviations from the reference prediction) depends on the nature of the data (categorical or continuous). In general, the following methods apply:

1. One can compare distribution of each variable either by using quantiles or another statistical test, to see if the variations are significantly different.
2. One can count occurrence of each label or category and compare.
3. One can employ a distance measure, such as the Mahalanobis distance, and look for big changes.
4. One can apply an absolute difference between new and old data, set a threshold, and report everything that exceeds the threshold.
5. One can apply a multidimensional technique, like correlation matrix, principal components, clustering, etc., and look for changes.
6. One can employ statistical/ML models specialized for anomaly detection, including Support Vector Machines, t-distributed Stochastic Neighbor Embedding, Isolation Forests, Peer Group Analysis or Break Point Analysis.

6.4 Database Objects

The database objects suitable for engineering product design, mission or retail planning are defined along with their associated attributes. By defining the databases based on function, four databases with seemingly reasonable attributes are proposed. The database management overhead associated with the proposed architecture is expected to be minimal.

1. Customer and Requirement Objects

Figure 12:
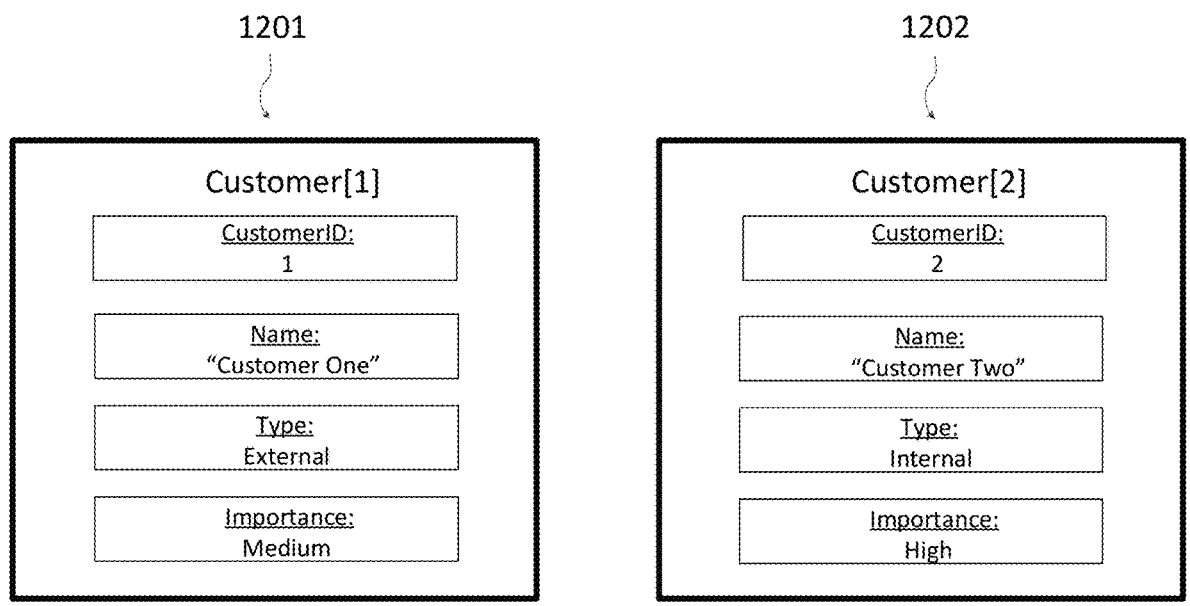
FIG. 12 provides an example of customer database objects. This drawing is adapted from (SteingrimssonYi 2017), but with additional context provided. The database objects for mechanical product design, along with their corresponding attributes, are defined based on function.
Figure 13:
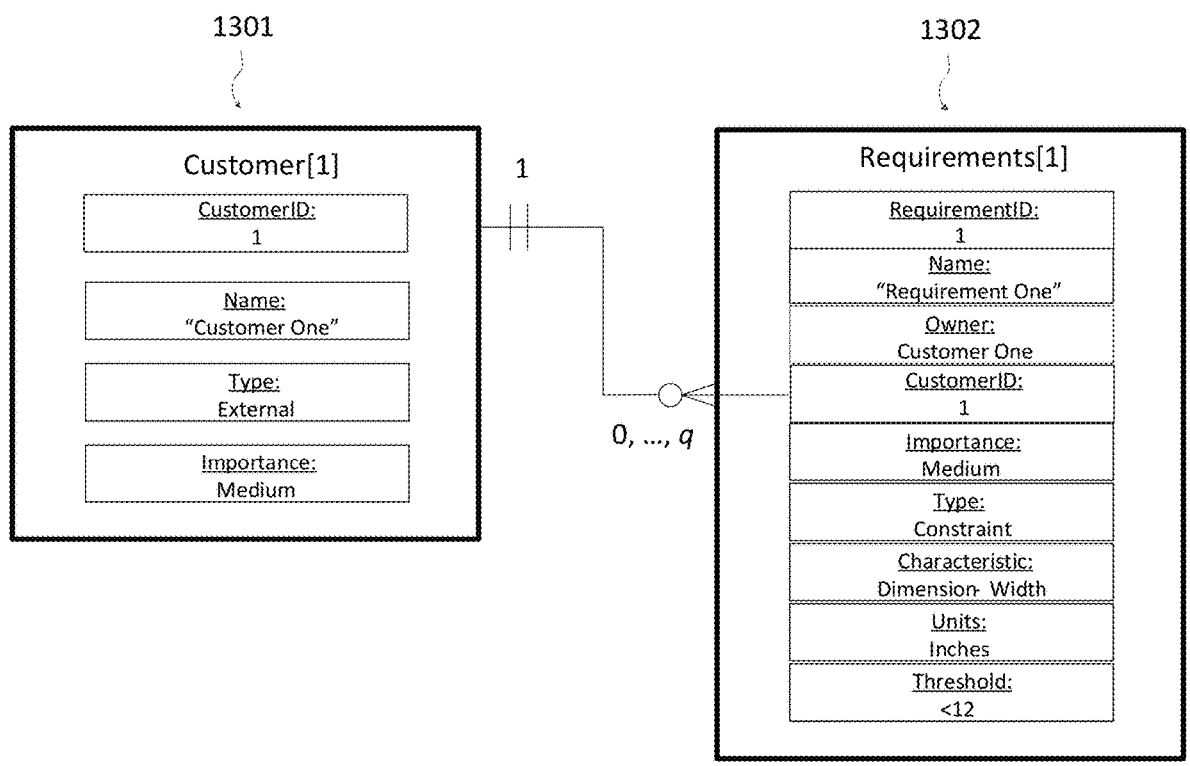
FIG. 13 offers an example of a requirement database object, together with its relational association with a customer object. Here we assume, for simplicity, that a given requirement originates from a single customer.

FIG. 12 and FIG. 13 present embodiments of customer and requirement objects from a database containing the PDS objects. Through the PDS, the designer builds up a collection of pointers to pertinent design information objects. It is of key importance to define proper attributes for the object pointers in the PDS database, and formulate metadata and leading indices (index maps) accordingly. For the PDS database, the object pointers considered pertinent are listed in Table 7 and Table 8. The constraints in Table 8 may be binary and can be relatively easy to verify. The performance requirements typically involve binary thresholds, and are judged in accordance to design performance relative to the threshold. The objectives involve no thresholds, but rather provide optimization considerations for decisions.

TABLE 7

Essential attributes pertinent to the customer objects in the PDS database.

| Attribute | Description |
| --- | --- |
| CustomerID | Unique ID for the customer object |
| Name | Organization, Person, Entity |
| Type | Internal, External, Other |
| Importance | Low, Medium, High |

Note the requirements are not listed in the customer objects, but the customers are listed in the requirement objects. This avoidance of duplicity, and cyclic relationships, is consistent with the design philosophy behind relational databases.

The framework for predictive analytics is capable of generating, managing, and presenting content with relevance to the design problem at hand in the databases available. It is assumed that, during the course of a design project, the database continues to grow. If design content is not readily available through a third-party or in-house, designers are apt to define it.

TABLE 8

Essential attributes pertinent to requirement objects in the PDS database.

| Attribute | Description |
| --- | --- |
| RequirementID | Unique ID for the requirement object |
| Name | Descriptive name for the Requirement object |
| Owner | Key to customer database: Customer[i] |
| Importance | Low, Medium, High |
| Type | Constraint, Performance or Objective |
| Function | Function (e.g., mechanics) that requirement is addressing |
| Characteristics | Key to characteristics database: Characteristic[j] |
| | Could be based on the function |
| Units | Key to units database: Units[k] |
| Threshold | Value for binary assessment |

FIG. 1 shows how the PDS object can be built using pointers to a database, for the purpose of being big data compatible.

2. Assembly and Component Objects

Figure 14A:
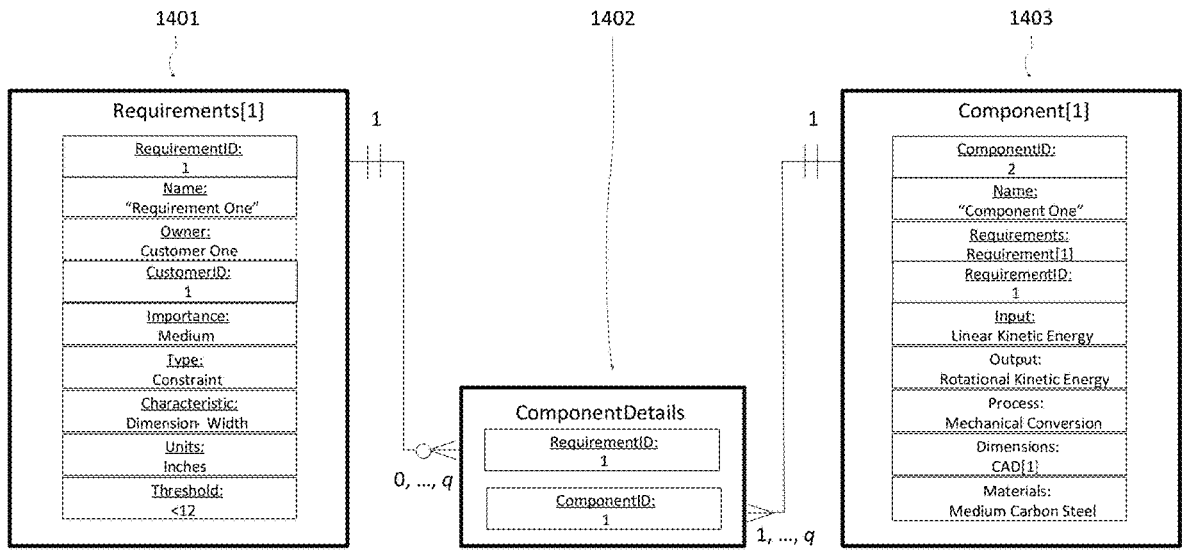
FIG. 14*a* and FIG. 14*b* provide an illustration of a design database with assembly and component objects, together with its relational association with a requirement object. Here we assume that a component or assembly object can address many requirements, and that given requirement may appear in many components or assemblies. Again, the database objects for mechanical product design, along with their corresponding attributes, are defined based on function.
Figure 14B:
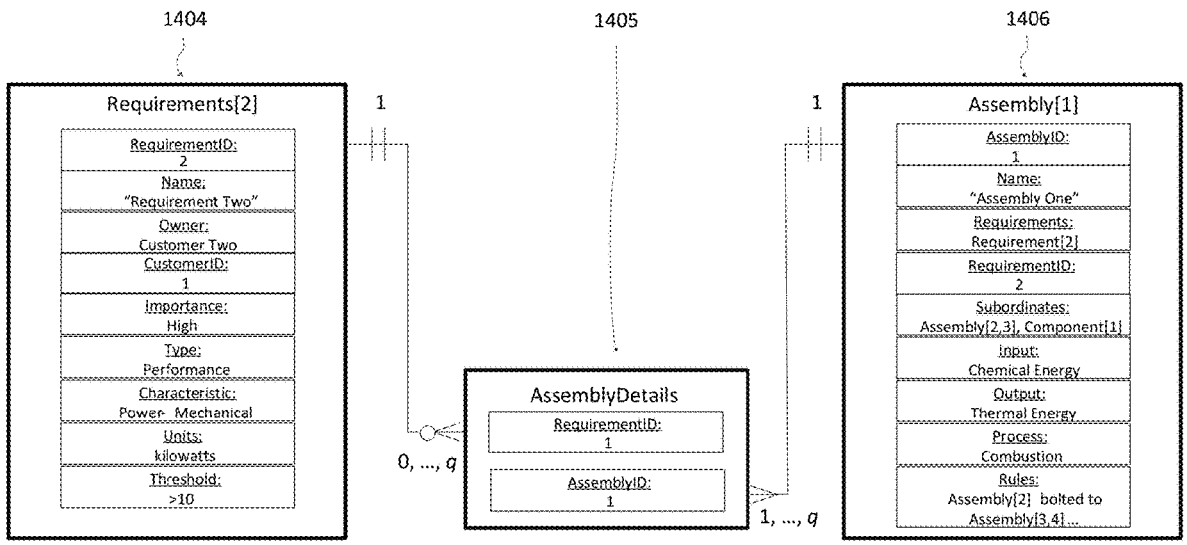

FIG. 14 presents an embodiment of the assembly and component objects from the design database. The assembly objects consist of nested, aggregated subordinate levels, and have authority to define requirements applicable to the subordinates. The component objects consist of individual parts, pieces, or obtainable, self-contained assemblies. In case of the Design database, the pertinent attributes for the assembly and component objects are listed in Table 10 and Table 9. The rules in Table 10 specify the governing constraints of aggregated subassemblies and components. It is assumed that the design database complies with standard relational database (schema) formats for big data compatibility.

In FIG. 14, we assume that a component or assembly object can address many requirements, and that given requirement may appear in many components or assemblies. The relational dependence between the assembly or component objects and the requirement objects is configured accordingly. Again, the database objects for mechanical product design, along with their corresponding attributes, are defined based on function.

TABLE 9

Attributes pertinent to components objects in the design database (SteingrimssonYi 2017).

| Attribute | Description |
| --- | --- |
| ComponentID | Unique ID of the component object |
| Name | Descriptive name for the Assembly object |
| Requirements | Key to the PDS database: Requirement[ ] |
| Input | Key to database: Flow[ ] |
| Output | Key to database: Flow[ ] |
| Process | Key to database: Process[ ] |
| Dimensions | Nominal and tolerance, in the form of solid model data |
| Material | Key to database (for material properties): Material[ ] |
| Properties | Description of miscellaneous properties |

TABLE 10

Attributes pertinent to assembly objects in the design database (SteingrimssonYi 2017).

| Attribute | Description |
| --- | --- |
| AssemblyID | Unique ID of the assembly objects |
| Name | Descriptive name for the Assembly object |
| Requirements | Key to the PDS database: Requirement[ ] |
| Subordinates | Define subassemblies and components |
| Input | Key to database: Flow[ ] |
| Output | Key to database: Flow[ ] |
| Process | Key to database: Process[ ] |
| Rules | Key to Rules database: Rules[ ] |

3. Mission Planning Objects

We apply the framework for predictive analytics to generate mission plans in near-autonomous mode, given the current work flow for mission planning, by leveraging data, models and standards in the core database for the mission planning system. The framework is capable of generating, managing, and presenting content with relevance to the mission plan at hand in the databases available. We define database objects suitable for mission planning, along with their associated attributes, based on the function desired.

Specifically, for multi-domain, multi-asset mission planning, the key to applying the framework for predictive analytics involves "correctly" collecting data into the database and tagging. All the domains and assets supported should have a universal index, and the indices should be recorded as a part of the Requirement objects, as shown in Table 11. There may be a "local" versions of the database, for each domain and/or asset. As you collect data into the "local" versions of the database, you may tag the data to indicate which domain or asset it corresponds to. Then you may have a "global", centralized database for all the assets and domains.

TABLE 11

Selected items from requirement objects for mission planning.

| Item | Explanation |
| --- | --- |
| Goals | The mission goals |
| Location | Location of the target |
| Target | Target selected |
| High-payoff targets | The high-payoff targets |
| Domain | To enable multi-vehicle mission planning (universal indexing of the domains) |
| Asset | To enable multi-domain mission planning (universal indexing of the assets) |
| Security level | To account for different security levels (standardized names of levels) |

4. External Databases

As shown in FIG. 1, FIG. 19, FIG. 21 and FIG. 23, the design content aggregated is multi-faceted and covers a broad spectrum of inputs. It not only consists of the project binders from the designers, but also includes existing and previous design projects within an organization, plus the linked-in design files, the outputs from the design tools, material from the industry databases (results from context verification), the configuration scripts, examples, content of sample databases provided, legacy databases for known good designs, search analytics, information on manufacturing procedures, material characteristics, material prices, and parts that can be obtained from elsewhere, etc. The result is a sizable database of useable information available to designers and design organizations.

5. An Overall Product Design

Figure 15:
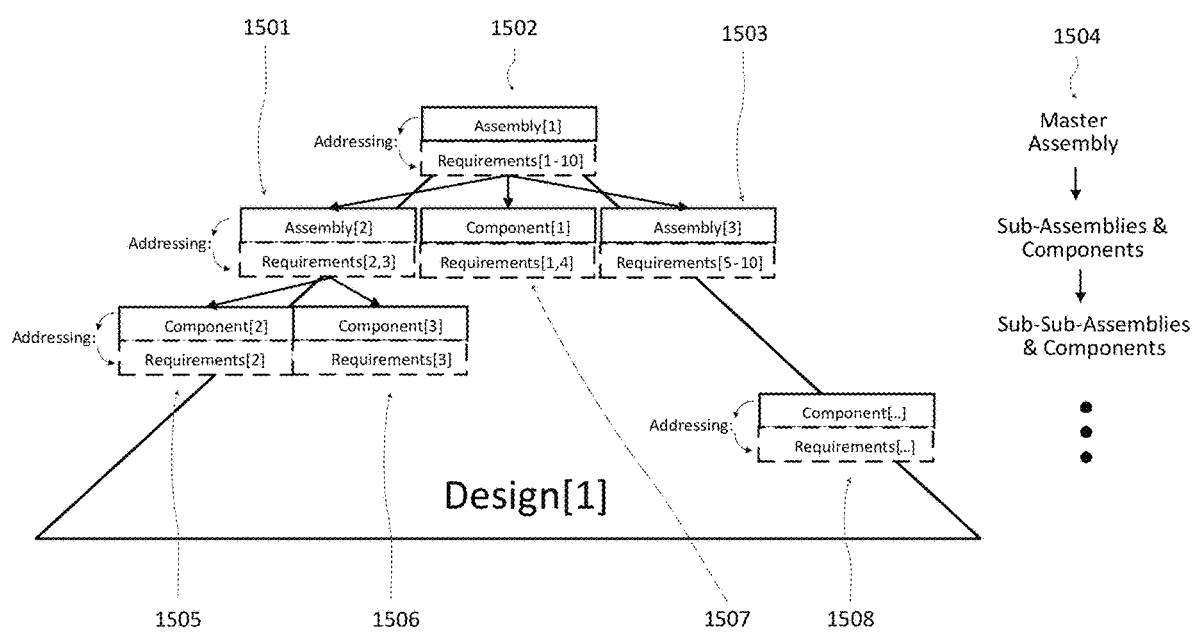
FIG. 15 illustrates how a master assembly object (a Level 0 object), along with the requirements that it addresses, can be represented in relation with sub-assemblies and components (Level 1 objects), along with the requirements that the sub-assemblies or components address.

FIG. 15 illustrates how a master assembly object (a Level 0 object), along with the requirements that it addresses, can be represented in relation with sub-assemblies and components (Level 1 objects), along with the requirements that the sub-assemblies or components address. FIG. 14 similarly shows how the Level 1 objects can be represented in relation to corresponding Level 2 objects (together with the requirements that the Level 2 objects address). FIG. 15 further provides an illustration of how the component options and associated requirements, for an overall design (one comprising of multiple subsystems), can be programmed into the database, based on engineering knowledge gleaned from prior designs. This knowledge may, for example, be related to machine design text awareness of risks for certain components or uses.

6.3 Data Annotation

In order to present a classification system suitable for engineering product design, mission and retail planning, we think of the collection of archived project binders (e-design notebooks (SteingrimssonYi 2017), (Steingrimsson 2014)) as books in a library. We assimilate the indexing of the project binders to cataloging of books in a library. And we compare the meta-data defined for the project binders to the index labels placed on the books. Similar to the index labels for helping with identification of books of interest, the meta-data facilities rapidly processing and accurately responding to designer queries. We assume the design content gets tagged, in a similar fashion as Google tags all websites, to facilitate queries reflecting the users' needs.

6.4 More on Data Tagging: Relations between Database Objects

1. Relational Databases

Big data analysis capabilities can be applied, for example, at organizations with design repositories arranged in the form of relational databases. The core concept, of project binders accessing data in databases holding all the design information, and creating pointers to the pertinent design content, may be adapted to other database structures.

2. Sample Relations between Database Objects

FIG. 13 illustrates a sample relation between the customer and requirement objects. Here we assume, for simplicity, that a given requirement originates from a single customer. FIG. 14 provides a sample illustration of the relation between component or assembly objects and the requirement objects, respectively. Again, we assume that a component or assembly object can address many requirements, and that given requirement may appear in many components or assemblies.

3. Efficient Tagging through Index Maps

The relational databases consist of index maps in addition to the data. The index maps allow you to find data efficiently. They mimic tags on books in a library. The tagging constructs a map of specific key words, enabling efficient search on a portion of the input design.

4. Note on Data Management

Binders for new design projects are assumed to have the same structure as the binders from the past design projects (and are assumed to be archived as such). Note that regardless of which Product Lifecycle Management system a design organization elects to use, the design data needs to be entered only once. The Ecosystem provides capability for exporting design data into formatted project reports. So the design data does not need to be entered more than once. Content from the exported reports can be used in progress reports or project presentations. As long as design organizations make sure that each design project gets archived after completion, data management is expected to require relatively minor effort.

6.6 Querying Engine

In the context of mechanical design, this invention assumes that a user need occurs as a mix of the following four elements: Function, cost, material, and energy. The first step in the analysis of project binders (e-design notebooks) involves automatic understanding of user needs. Here, the querying engine is expected:

1. To comprehend statements of user need/requirement.
   For this purpose, we treat a user need as a query.
2. To retrieve previous design information, or examples, that yield a good match to the user need.

In the process of doing so, the information retrieval framework presented can provide design teams (workforces) with design information similar to the ones previously reported and harvested, for the purpose of enhancing design efficiency and efficacy. To deal with these tasks, we propose to adopt an indexing and retrieval method from the field of information retrieval, one referred to as Latent Semantic Analysis.

1. Latent Semantic Analysis

LSA is an extension of a classic IR model, the Salton's Vector Space model (VSM) (Salton 1975). LSA was developed as an information retrieval technique that discovers hidden semantic structure embedded in documents (Deerwester 1990). It is an unsupervised technique for mapping high-dimensional count vectors to a lower dimensional representation. In more detail, complex relationships exist between words and surrounding contexts, such as phrases, statements or documents, in which the words are located. For the discovery of latent semantic relationships (correlations), LSA begins with the creation of a co-occurrence matrix, where the columns represent contexts and the rows represent words or terms. An entry (i, j) in the matrix corresponds to the weight of the word i appearing in the context j. The matrix is then analyzed by applying Singular Value Decomposition to derive the associated hidden semantic structures from the matrix. SVD is a way to factorize a rectangular matrix. For an m-by-n matrix, A, with m>n, the singular value decomposition of the matrix A is the multiplication of three matrices: An m-by-r matrix U, an r-by-r matrix $\Sigma$, and the inverse of an n-by-r matrix V, in that order. That is, $$A = U\Sigma V^T. \tag{17}$$

Here, $V^T$ is the matrix transpose of V, obtained by exchanging V's rows and columns. Then, U and V have orthonormal columns and $\Sigma$ is a diagonal matrix. Such a multiplication form is referred to as the SVD of A. The diagonal elements of $\Sigma$ are all positive and ordered by decreasing magnitude. The original matrix, A, can be approximated with a smaller matrix, $A_K$, where $A_K$ is obtained by keeping the first k largest diagonal elements of $\Sigma$. By definition, k is the rank of the matrix $\Sigma$. By applying SVD factorization to the matrix A, context (e.g., a set of statements characterizing user needs) is represented in a much smaller dimension, k, rather than the original high dimension, m. Note that $$k \leq n, \tag{18}$$

$$n \ll m. \tag{19}$$

As a result, a context is represented in a lower dimensional space, rather than in the full, much higher dimension.

k is referred to as the dimension of the latent semantic structure of A. A comprehensive overview of LSA can be found in (Dumais 2004).

2. LSA-Based Approach

The goal of the LSA-based approach proposed is to provide designers with access to previous design records that are relevant to the designers' need. In the vocabulary of Information Retrieving, a designer's need is equivalent to a query.

LSA is adopted as the framework of retrieving designers' needs in this invention, because the method has been proven to be an effective unsupervised algorithm for IR (Laundauer 2007). In fact, for purpose of the querying engine, we are not considering a supervised learning approach, such as neural networks or deep learning, since such an approach requires a very large amount of previous e-design examples, or cases, that presently are unavailable.

Figure 16:
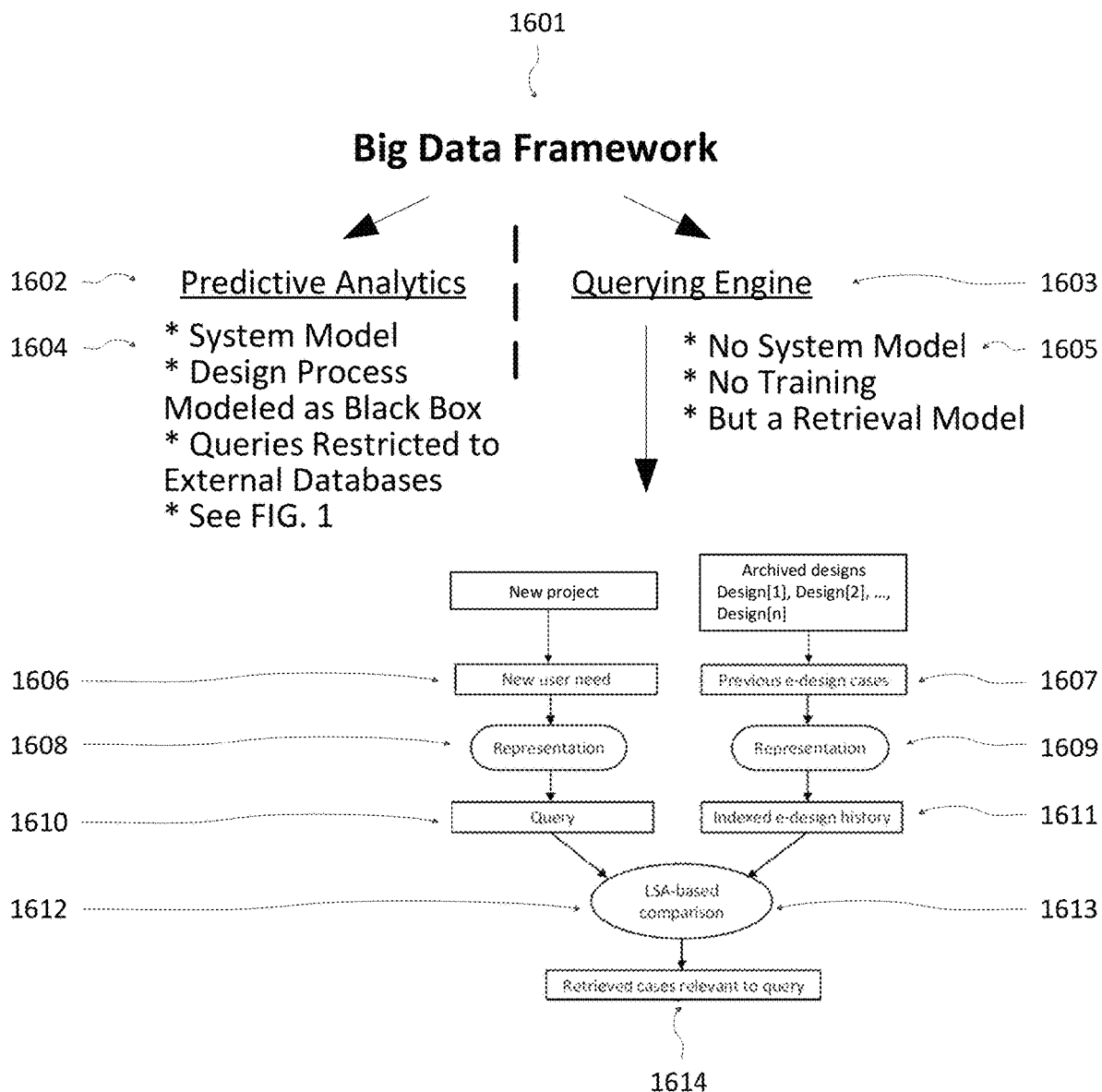
FIG. 16 provides an illustration of the process of retrieving previous e-design history relevant to a user query. We refer to this process as the querying engine.

FIG. 16 depicts an LSA-based approach of retrieving e-design cases that are likely to satisfy a query (i.e., a user need). The LSA-based method predicts the degree of relevance of e-design examples to the query and presents the most relevant previous e-design cases, or examples, to the user.

3. Complexity

The algorithms for Latent Semantic Analysis and Latent Semantic Indexing are based on Singular Value Decomposition. The time complexity for extracting the SVD of a m×n matrix is bounded by (Trefethen & Bau III 1997)

$$O(m^*n^2) FLOPs. \qquad (20)$$

Here, m refers to the number of terms, and n to the number of documents.

4. Example Involving Mechanical Product Design

A simple example is presented here to show how the semantic framework for analysis of users' needs can help with idea generation (brainstorming) in the Concept Design stage of a project involving the design of a reliable, single-operator Go Kart lift stand. This may be a capstone project, where the experience of the designers in the area may be somewhat limited. Therefore, they simply pose the following as input to the querying engine:

"We need a reliable, single-operator stand for kart racers".

The system responds to the stated need by offering a number of ideas or options. Based on what can be retrieved from the databases, or the training data available, the system may offer the following suggestions:

"1. JEGS Multi-Purpose Lift
2. KartLift BigFoot
3. KartLift Winch Lift
4. Electric Super Lift
5. Go Kart Stand Lift".

Figure 18:
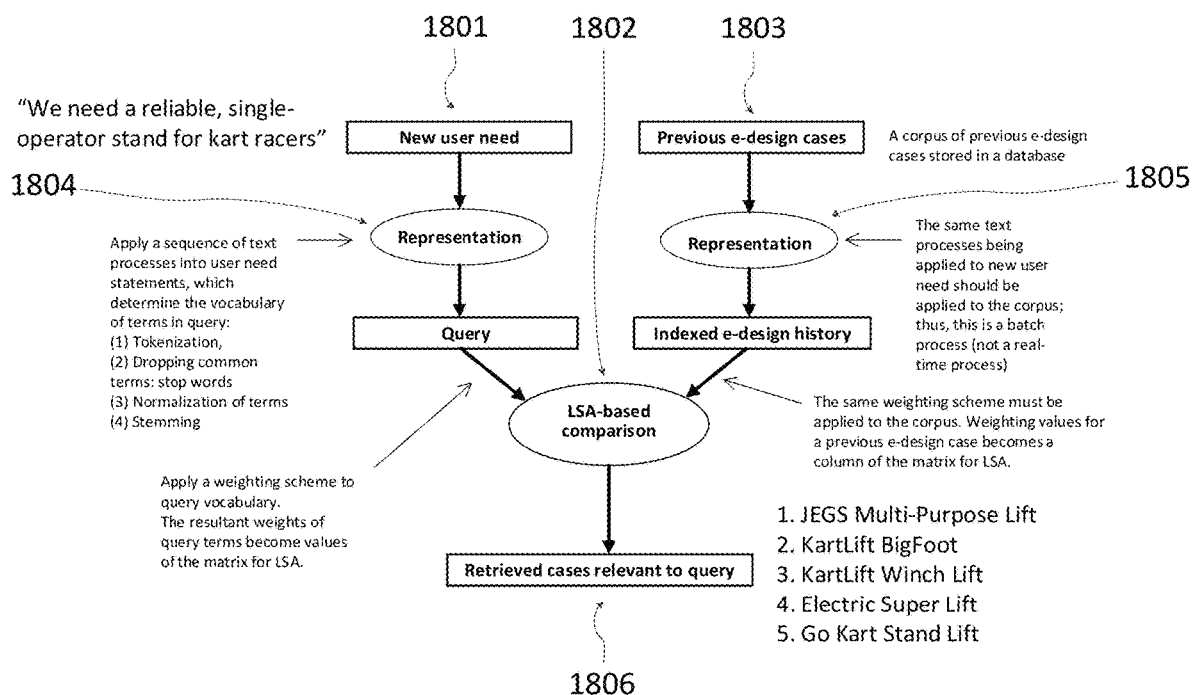
FIG. 18 presents detailed explanations related to application of the process of retrieving previous e-design history relevant to the user input query from FIG. 16.

Supplementing the overall process outlined in FIG. 16, FIG. 18 lists intermediate steps elucidating how the engine for latent semantic analysis is able to arrive at this conclusion.

While this example may come across as relatively simple (many mechanical designers may have a clue as to what type of lift stands are available), it conveys an application (illustrates the purpose) of the querying engine. More nuanced examples can be crafted, say, around specific standards, policies, material properties or common components. To our knowledge, there is presently no systematic search available for helping designers with brainstorming during concept design.

5. Example Involving Strike Mission Planning

FIG. 20 presents an example showing how the LSA-based approach can be used to retrieve cases that are likely to satisfy an input query from a strike mission planner (i.e., a user need). The LSA-based method predicts the degree of relevance of the archived examples to the query and presents the most relevant previous cases, or examples, to the mission planner.

6. Example Involving Surface or Underwater Mission Planning

FIG. 22 presents a similar example showing how the LSA-based approach can be used to retrieve cases that are likely to satisfy an input query from a surface or underwater mission planner (i.e., a user need). The LSA-based method predicts the degree of relevance of the archived examples to the query and presents the most relevant previous cases, or examples, to the mission planner.

7. Note about Practicality

Note that the user does not need to worry about parsing of the input query. The representation step of the querying engine is invisible to the user. The user provides the input query in the form of a sentence, such as the ones in FIG. 18, FIG. 20 or FIG. 22. The sentence may even be provided verbally with the help of a speech recognition system.

6.7 More on Training for the Predictive Analytics

The predictive analytics framework presented assumes a holistic big data analysis and efficient utilization of a broad spectrum of available information. Through proper database representation of the design content, in the form of composite design objects (Design[t]), and references from the design project journals, one can categorize the data and run various cross-correlations (queries) across projects or within projects. By storing the comprehensive design history in a cloud, and harvesting repositories of known good designs through database queries, one can improve the design decision fidelity for new designs. Access to such repositories may also prove invaluable for the purpose of post-mortem failure analysis.

The big data frameworks in FIG. 1, FIG. 19, FIG. 21 and FIG. 23 can be trained, for example, using the Delta Rule, mentioned above, which is also sometimes referred to as the Widrow and Hoff learning rule, or the Least Mean Square rule (Widrow 1960):

$$\Delta w_{ijx} = -\varepsilon \frac{\delta E}{\delta w_{ij}} = \varepsilon \, \delta a_{ix}. \qquad (16)$$

Here $\Delta w_{ijx}$ represents the update applied to the weight at node (perceptron) between links i and j in a neural network (Widrow 1960). E represents an error function over an entire set of training patterns (i.e., over one iteration, or epoch) (Widrow 1960). £ is a learning rate applied to this gradient descent learning. $a_{ix}$ denotes actual activation for node x in output layer i (Widrow 1960).

6.8. Validating the Integrity of Archived Data—The Impact of Incomplete Data

1. Predictive Analytics

We put high emphasis of only training the system model on known good design (designs qualified as having all requirements fulfilled), even though 1. It is possible you get a guiding reference of some value, even if you relax the constraint about the archived designs being qualified as good;
2. It is of course much easier to get started if you relax the constraint, esp. for organizations with large databases of legacy designs.
3. We are recommending the neural network solution in the event of a large set of archived binders.

In the event of a small to intermediate number of archived binders, we are recommending multi-variate linear regression for training the system model.

Once you relax the constraint of the archived designs being of good quality, the quality of the output will be un-deterministic. In the worst case, the quality of the guiding reference may soon be impacted (significantly?), if one were to relax the constraint on the bad designs. Are 90% of the designs good or only 10%? Even if the system model were trained based on designs, only 50% of which had been qualified as good, the quality of the guiding reference might be suspect. We want to take steps to protect against the possibility of "garbage in" producing "garbage out".

2. Adopting Designs from a Legacy Database (Whose Designs are Yet to be Qualified as Good)

As a practical way to adoption of the big data framework by companies, that have a large database of legacy designs, that are yet to be qualified as good, we recommend incremental re-training.

Even in the case of a large database of legacy designs, we recommend starting out by identifying a (small) set of good designs on which to train the system model. Then you incrementally expand the training set, but qualify the new designs from the legacy database, either through automatic requirement verification provided by SW like the Ecosystem or by a human. Then you retrain the system model, once you have qualified the new input. In this way, you can expand the training set in a controlled fashion, and refine the system model, and yet maintain quality of the archived designs comprising the training set.

2. Querying Engine

Most search engines are based on similar concepts as the querying engine presented (information retrieval). LSA is less sensitive to data scarcity than many supervised machine learning techniques. It's assumed that the LSA returns hits closely matching an input query. With an appropriate threshold being set, LSA can tell how many matches there are to the input query. In this sense, the querying engine is capable of gracefully accounting for cases of incomplete data.

6.9 Accommodations Specific to Incremental or Remedial Design Projects

1. Single Reference Design

In case of an incremental or remedial design project, based on a single reference design, there is no need for predictive analytics. As opposed to generating a guiding reference, y, through predictive analytics, the original reference is the guiding reference.

2. (Small) Sub-Set of Reference Designs

The matrix $\tilde{W}$ enables specification of the (small) sub-set of designs to be used reference in this case. Here, one could still produce the guiding reference as $$y = \hat{B}^T x.$$

But $\hat{B}$ would be obtained as solution to (14), where row j of $\tilde{W}$ consisted of all ones if and only if archived vector $\tilde{x}_j$ was among the few vectors in the (small) sub-set.

6.10 Accommodations Specific to Mission Planning

1. Accommodations of Highly Dynamic Environments—Dynamic Re-Planning

Dynamic re-planning can be accounted for relatively easily, in principle: Once you have a new input (a new "requirement" vector), you receive the system output (the guiding mission plan) near instantaneously.

If things get heated in battle, due to an action of an adversary, and decisions needed to be made on the fly, we may hold off presenting the corresponding guiding advisories, unless components of the guiding plan fulfilled minimum quality criteria.

Further, as new information become available, one can conduct incremental training updates of the system model. The framework for predictive analytics employs supervised learning. The system is trained once in the beginning based on the archived (Requirement, Mission plan)

duplets available. But the longer the trained system is used, and as more information becomes available, one can conduct incremental training updates.

2. Rapid and Continuous Planning when New Information Necessitates Updating

Similarly, rapid and continuous planning can be accounted for relatively easily, in principle: Once you have a new input (a new Requirement vector), you receive the system output (the guiding Mission Plan) near instantaneously.

3. Multi-Vehicle, Multi-Domain Mission Planning: Generation of Mission Plans in a Near-Autonomous Mode, Given the Current Workflow for Mission Planning Key to applying the framework for predictive analytics to multi-vehicle, multi-domain mission planning is to "correctly" collect data into the database and tag. All the vehicles and domains supported can have a universal index, and the indices can be recorded as a part of the "requirement" objects, as shown in Table 11. There may be a "local" version of the database, for each vehicle and/or domain. As you collect data into the "local" versions, you may tag the data to indicate which domain or asset it corresponds to. Then you may have a "global", centralized database for all the assets and domains, with whom the "local" versions synchronize their data.

4. Accounting for Different Security Levels

In combat, the crew that plans a mission is typically not the crew that executes it, so decisions are sometimes made to enable as much flexibility as possible, and delegate the decision authority to the lowest possible level (i.e. the person in the cockpit). Our general approach will be to comply with Navy protocols in this regard. As shown in Table 11, the security level can be recorded as a tag in the database for the input "requirements", in the archived duplets for (Requirement, Mission plan).

One can record the security levels using a standardized scheme.

6.10. Support for Pertinent Interfaces

1. Interface with Spark or Hadoop for Big Data Analysis

Regarding the type of interfaces that the system will be able to support (regarding the system's ability to support both heterogeneous (distributed) and homogeneous architectures), one should note that large, distributed databases (enterprise applications), such as Apache Hadoop or Spark, can be supported through the API interfaces provided by these tools (Spark 2017). Hadoop provides a native Java API to support file system operations (BigData 2017). One can use WebHFDS to interact with the Apache Hadoop file system externally through a more user friendly REST API (Hadoop 2017). WebHDFS concept is based on HTTP operations like GET, PUT, POST and DELETE (Hadoop 2017). Operations like OPEN, GETFILESTATUS, LISTSTATUS are using HTTP GET, while others like CREATE, MKDIRS, RENAME, SETPERMISSIONS are relying on HTTP PUT (Hadoop 2017). The APPEND operation is based on HTTP POST, whereas DELETE is using HTTP DELETE (Hadoop 2017). Authentication can be based on user.name query parameter (as a part of a HTTP query string). If security has been turned on, then the authentication relies on Kerberos (Kerberos 2017).

2. Interface with JMPS System for Strike Mission Planning

Figure 24:
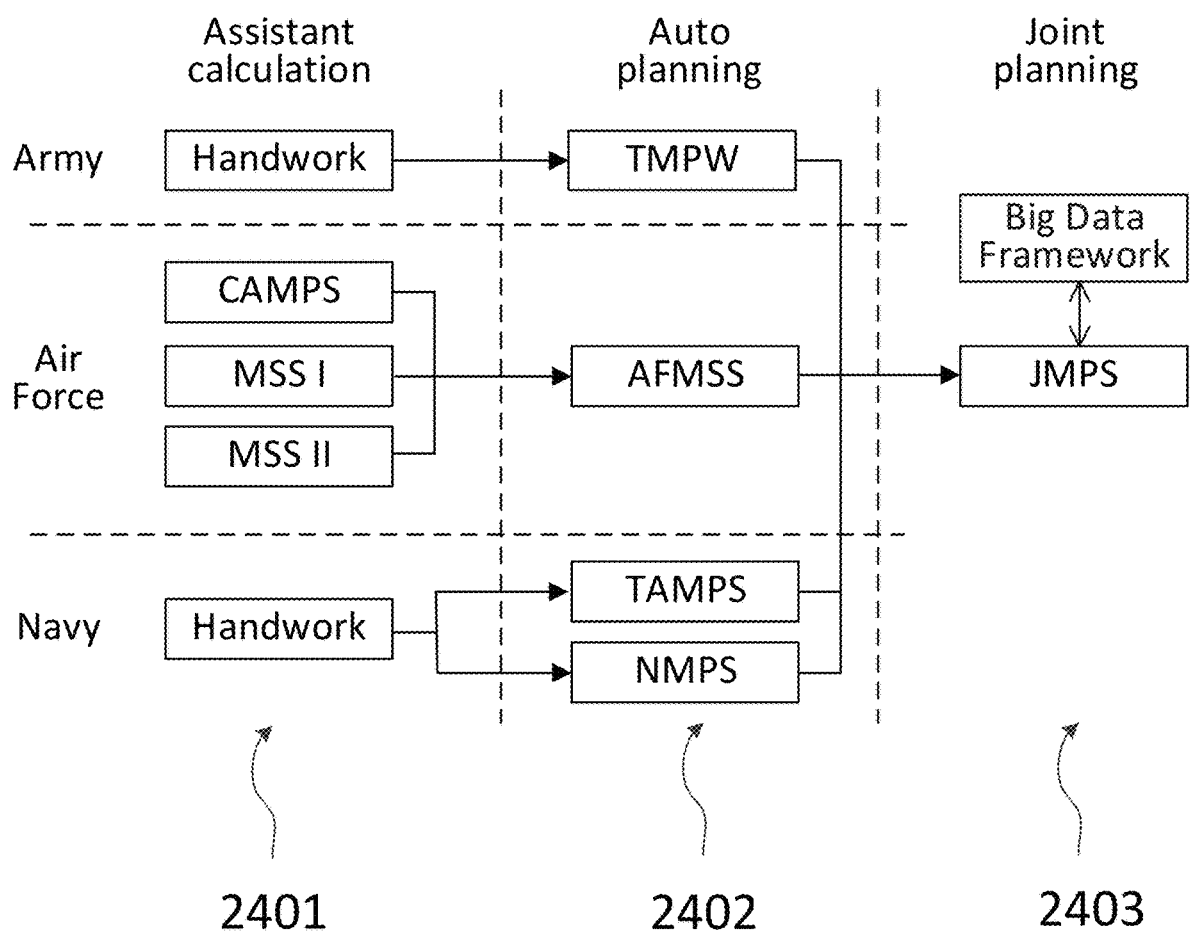
FIG. 24 presents the machine learning framework as a high-level framework of learning methods overlooking JMPS. The big data framework provides advice to JMPS, based on outcomes and performance data provided.

The Joint Mission Planning System is a software application that consists of a basic framework together with unique mission planning environment software packages for various platforms (TianWeiYaoping 2016). FIG. 24 outlines one way of integrating the big data framework into JMPS. We are presenting a high-level framework of learning methods that can overlook JMPS. The big data framework can offer advice to JMPS, based on outcomes and performance data provided.

3. Interface with the MEDAL System for Surface and Underwater Mission Planning

Figure 25:
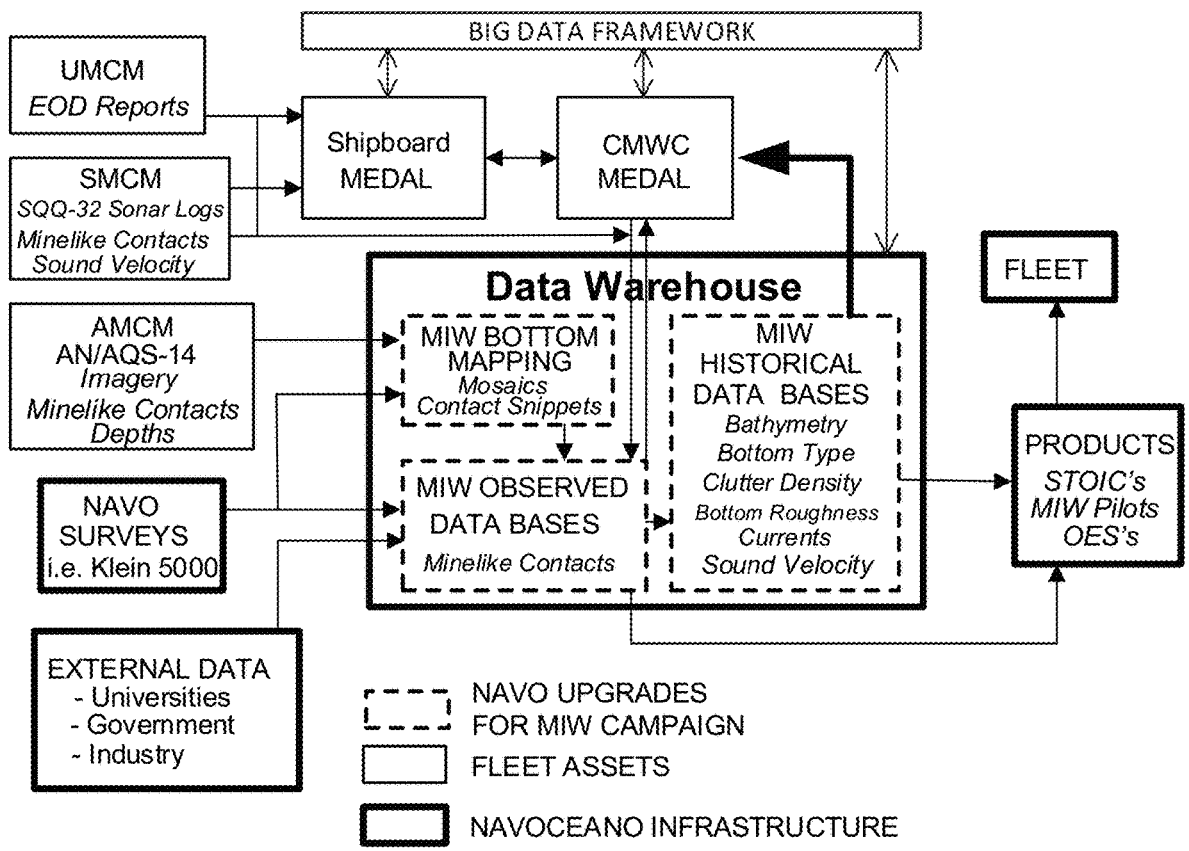
FIG. 25 presents the big data framework as a high-level framework, containing machine learning methods that interface with the Shipboard MEDAL, the CMWC MEDAL, and the data warehouse.

FIG. 25 shows how the big data framework can offer advice to the Shipboard MEDAL, the CMWC MEDAL and the data warehouse systems, based on outcomes and performance data provided. In current mine warfare mission planning, historical oceanographic data are acquired from the NAVOCEANO database, also listed in FIG. 25. These data, including seafloor characteristics, water column properties, and atmospheric parameters, are input into MEDAL to determine optimal lane spacing and predict operational time lines and risk. Once into the exercise, in situ data are collected and input into MEDAL and other tactical decision aids, used for naval warfare mission planning. When in situ data are entered into MEDAL, the operator can output predictions of best and worst-case scenarios for line spacing to balance operational objectives with clearance time and risk. It is important at this stage of operations that mine warfare personnel be receptive to modifying tactics to fit changes in environmental conditions.

7. How to Use the Invention

1. For Improving Fidelity of Design Decisions through Comparison with a Reference Forecast FIG. 1 summarizes this application. The vector y captures the reference forecast. When decisions made during the course of a new design project deviate from the reference, this prompts a case (anomaly) likely worth investigating. The invention addresses harvesting of information from past engineering design projects for the purpose of aiding future design projects.

2. For Idea Generation: Querying for Solution Options

Figure 17:
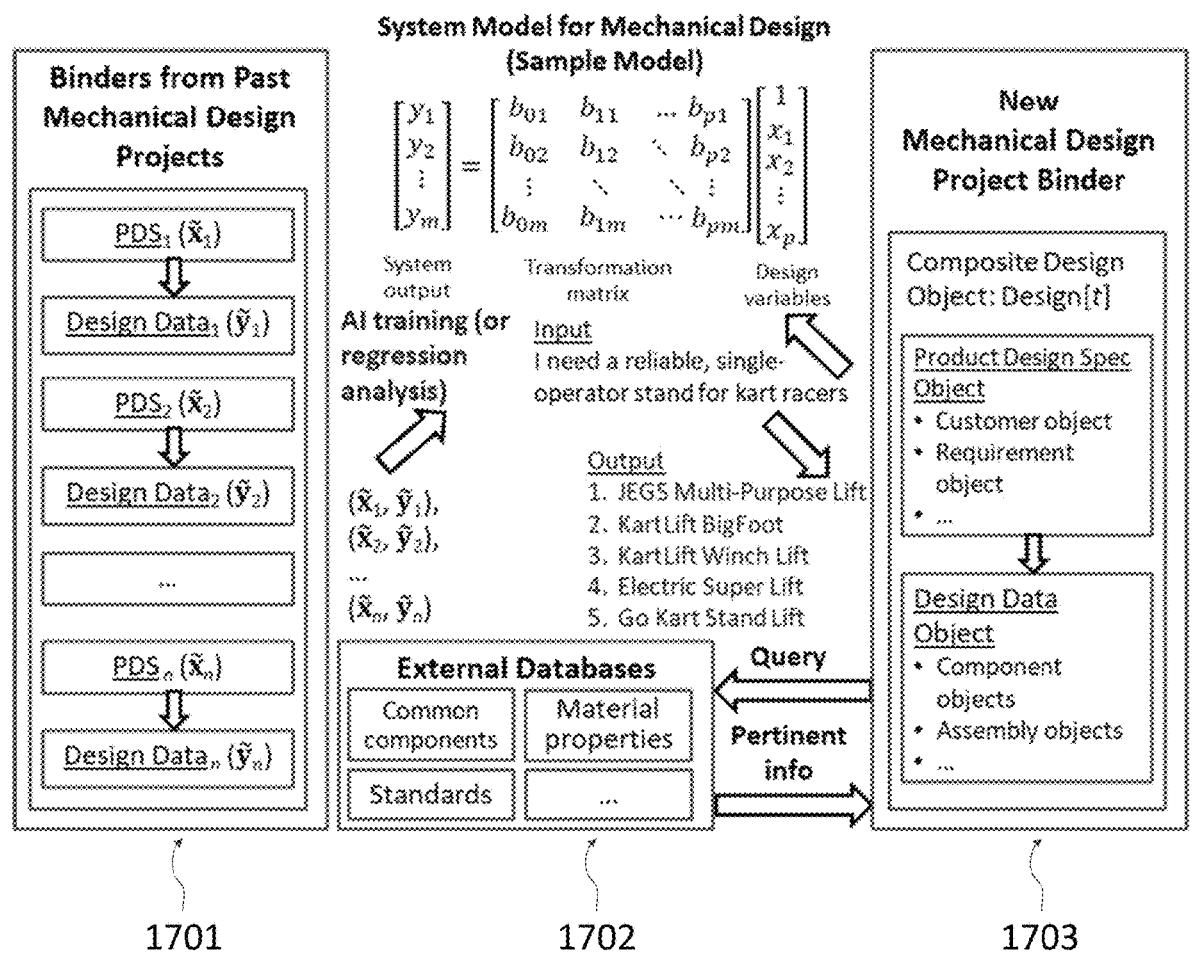
FIG. 17 illustrates how the big data framework can be applied to the Concept Design stage of a project involving the design of a single-person Go Kart lift stand.

FIG. 17 and FIG. 18 summarize such an application.

3. For Querying for Common Components

This invention can be used to query external databases for common components used in a design, as FIG. 1 highlights.

4. For Querying for Information Related to Standards

This invention can be used to query external databases for engineering standards pertinent to a design, as FIG. 1 highlights.

5. For Querying for Information Related to Material Properties

This invention can be used to query external databases for the properties of materials considered for us in a design, as FIG. 1 highlights.

6. For Querying for Information Related to Regulations

This invention can be used to query external databases for regulations that may impact a design.

7. For Querying for Information Related to Policies

This invention can be used to query external databases for policies that may impact a design.

8. For Querying for Customer Related Information

This invention may be used to query for information related to customers involved in a design.

9. For Querying for Information Related to Internal Requirements

This invention may be used to query for information related to internal requirements involved in a design.

10. For Querying for Information Related to Best Practices

This invention may be used to query for information related to best practices involving a design.

11. For Querying for Information Related to Previous Solutions

This invention may be used to query for information related to previous design solutions.

12. For Querying for Information Related to Analogies

This invention may be used to query for information related to analogous solutions.

13. For Querying for Other Information Related to Detailed or Final Design

This invention may be used to query for other information related to the detailed or final design stages of a design project.

14. For Design Projects Involving Incremental Changes or Remedial Efforts

This invention can be used on design projects involving incremental changes or remedial efforts, as explained in 6.9 above. The driver may involve cost savings, material change, etc.

15. For Design to Manufacture, or Simply for Manufacture

The predictive analytics and the querying engine may be used both to design an engineering product as well as to design the equipment used to manufacture the design. In case of mechanical design in industry, separate department may be responsible for designing parts and designing the molds that make the parts. Decisions made during the design of the molds can have significant cost implications. For example, in manufacture of a key board, do you manufacture the keys in a group or individually? Are you going to use single-shot molding or double-shot? If you misplace the position of the screw, where the plastic flows into the mold, there can be significant cost penalty.

16. For Maritime Mine Detection and Neutralization (for Surface or Underwater Mission Planning)

This invention may be used for continuous planning for maritime mine detection and neutralization using unmanned vehicles. Assets involved may include submarines or ships to be protected from the mines. The ocean environment significantly influences mine warfare tactical planning (OceanStudies 2000). Understanding of nearshore environmental variability is important, not only for physical mine placement but also for its impact on mine hunting sensors (OceanStudies 2000). The coastal environment tends to be complex and may lack of high-resolution nearshore oceanographic and bathymetric data, particularly in areas of potential conflicts (OceanStudies 2000).

17. For Guiding Near-Autonomous Generation of Strike Mission Plans

Figure 19:
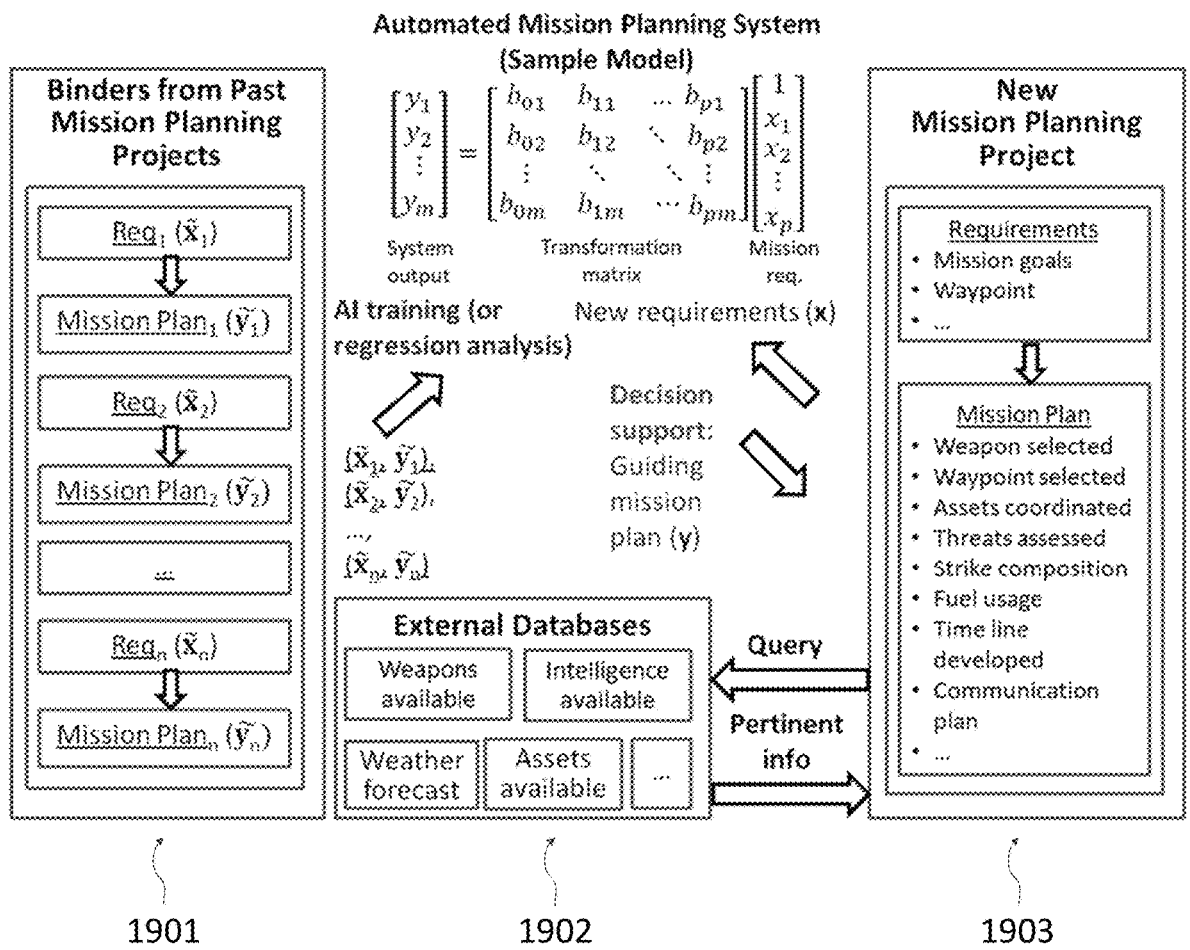
FIG. 19 outlines the high-level framework for applying predictive analytics to automated planning of aerial strike missions.

For specifics on application of the invention to strike mission planning, refer to FIG. 19 and FIG. 20.

18. For Automatically Acquiring and Continually Updating Asset Performance Models and Tactical Planning Knowledge, in Order to Improve Decision Support by Automated Mission Planning Systems For specifics on application of the invention to surface or underwater mission planning, refer to FIG. 21 and FIG. 22

FIG. 25 shows how the invention can fit into the information systems presently used, such as the Mine Warfare Environmental Decision Aid Library.

19. For Use in Conjunction with Automatic Requirement Verification

The invention can be used in conjunction with automatic requirement verification, such as within the automotive or avionics industries. The invention can help contribute to the making of safe autonomous vehicles, vessels or aircrafts.

20. For Mission Command

The invention can harvest operational data for the purpose of providing predictions, alerts, and recommendations. An autonomous learned system (machine learning) can understand large amounts of data, manage the results, and react to cyber defense, electronic warfare, and even large raid attacks. The big data framework can help enhance human performance in the processing of information management and knowledge management during exercise of Mission Command.

21. For Retail Planning and Supply Chain Management

Figure 23:
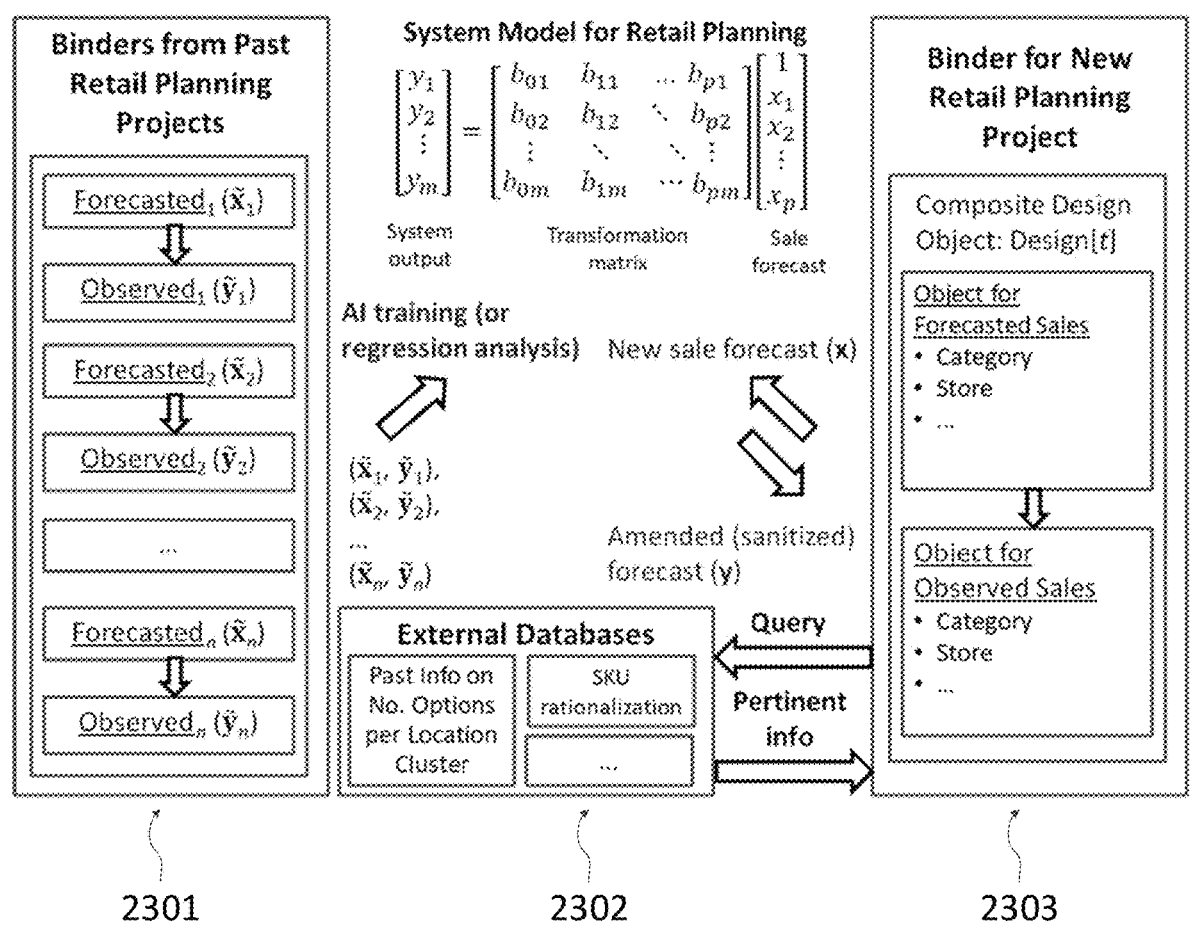
FIG. 23 presents application of the framework for predictive analytics to retail planning and supply chain management.

For specifics on application of the invention to retail planning and supply chain management, refer to FIG. 23.

22. Other Applications

Other private sector applications may include survey and first responder operations. Solutions for multi-vehicle, multi-domain mission planning may benefit various companies that deal with parcel delivery such as Amazon, UPS, FedEx, and others by generating autonomous mission plans (optimized delivery plans for either multiple ground and air vehicles). Another field that may benefit is traffic engineering, providing an dynamic approach to traffic control based on various traffic conditions.

8. Further Examples of the Invention

Thus, it will be appreciated by those skilled in the art that the present invention is not restricted to the particular preferred embodiments described with reference to the drawings, and that variations may be made therein without departing from the scope of the invention This invention claims:

1. An apparatus for predictive analytics, one that utilizes vector entities archived from past design or planning projects, for the purpose of facilitating decision making on new design or planning projects, the apparatus comprising;
   one or more processors;
   memory coupled to the one or more processors and storing instructions, which, when executed by the one or more processors, causes the one or more processors to perform operations comprising:
      operations for accessing a database for storing the vector entities, with one vector entity representing an input vector from a past design or planning project, and another vector entity representing a corresponding known good output vector,
         with the known good output vector being defined as an output vector that fulfills original requirements imposed on the archived past design or planning project,
      operations involving a system model,
         where the system model relates the output vector to the input vector, where the system model is derived from the archived vector entities, and where inputs to the system model represent intended features but outputs represent observed features, where
         the system model supports input vectors with elements taking on continuous or categorical values, where the values are confined to a range or not, and where
         the system model approximates a generic continuous-valued system model with a two-layer feed-forward neural network,
      operations for prediction, to produce a guiding reference for a new design or planning project, where the guiding reference is obtained as output from the system model when applying an input vector from the new design or planning project as input;
   the database with relational dependence between objects, to support fast and efficient searches, even in case of large design or planning project archives, with fast and efficient searches being defined in terms of speed improvements resulting from ability of relational databases to offer indexed searches with sub-linear-time lookups, compared to linear-time lookups for some non-relational databases, and with the large design or planning project archives defined as consisting of at least hundreds of design or planning projects archived,
   wherein the database has hierarchical structure,
   wherein the database is capable of storing at least hundreds of design or planning projects.

2. The apparatus according to claim 1, an apparatus wherein the composition of said vector entities includes
   the input vector, which captures product design specification,
      and which further comprises a requirement object associated with a customer object,
   the output vector, which captures design data observed, and which further comprises component objects, sub-assembly objects, assembly objects, component or assembly design options, descriptors related to the properties of the component or assembly objects, metadata related to hierarchical dependence between the component and assembly objects, metadata related to design risks identified, metadata related to mitigation of design risks, metadata related to calculations or analysis of design components, sub-assemblies or assembles, metadata related to results from design testing, metadata related to requirement validation, metadata related to a bill of material for the design, metadata related to manufacturing option for the design, metadata related to cost of the design or metadata related to design reviews or design documentation, or metadata related to revisions of the design.

3. The apparatus according to claim 2, wherein the definition of the customer object includes a specification of a unique identifier for the customer,
   a specification of a name for the customer.

4. The apparatus according to claim 2, wherein the definition of the requirement object includes
   a specification of a unique identifier for the requirement,
   a specification of a name for the requirement,
   a specification of a customer with whom the requirement is associated.

5. The apparatus according to claim 2, wherein the definition of the assembly objects includes
   a specification of a unique identifier for each assembly object,
   a specification of a name for each assembly object,
   a specification of the requirement, or requirements, that each assembly object addresses.

6. The apparatus according to claim 2, wherein the definition of the component objects includes
a specification of a unique identifier for each component object,
a specification of a name for each component object,
a specification either of the requirement, or requirements, that each component object addresses, or of the assembly, sub-assembly, assemblies or sub-assemblies, that the component corresponding to each component object is a part of.

7. The apparatus according to claim 2, wherein the objects in the database with the hierarchical structure include a master assembly object, that specify the requirements that the master level object addresses,
sub-assembly objects and components, that depend on the master assembly object, and that specify the requirements that the sub-assembly or component objects address,
sub-sub-assembly objects and components, that depend on the sub-assembly objects, and that specify the requirements that these sub-sub-assembly or component object address,
subsequent levels of hierarchical representation of assembly objects and components, together with the requirements that these objects address, as needed to represent a design with the accuracy and detail desired.

8. The apparatus according to claim 2, wherein the database is structured such that component options and risks are programmed into the database based on existing engineering knowledge.

9. The apparatus according to claim 2, wherein the apparatus interfaces with APACHE HADOOP, APACHE SPARK, APACHE FUNK, or another software framework for distributed processing or storage of large data sets, through application program interfaces provided by the software frameworks.

10. A method for predictive analytics, one that utilizes vector entities archived from past design or planning projects, for the purpose of facilitating decision making on new design or planning projects, a method that further utilizes
a database access step, for accessing the vector entities,
with one vector entity representing an input vector from a past design or planning project, and another vector representing a corresponding known good output vector,
with the known good output vector being defined as an output vector that fulfills original requirements imposed on the design or planning project archived,
with relational dependence between objects stored in the database accessed, to support fast and efficient searches, even in case of large design or planning project archives, with fast and efficient searches being defined in terms of speed improvements resulting from ability of relational databases to offer indexed searches with sub-linear-time lookups, compared to linear-time lookups for some non-relational databases, and with the large design or planning project archives defined as consisting of at least hundreds of design or planning projects archived,
wherein the database has hierarchical structure,
wherein the database is capable of storing at least hundreds of design or planning projects;
a system model access step, for relating the output vector to the input vector, where the system model is derived from the archived vector entities, and where
inputs to the system model represent intended features but outputs represent observed features,
the system model supports input vectors with elements taking on continuous or categorical values, where the values are confined to a continuous range or not,
the system model approximates a generic continuous-valued system model with a two-layer feed-forward neural network,
a prediction step, for producing a guiding reference for a new design or planning project, a reference obtained as output from the system model when applying a vector from the new design or planning project as input.

11. The A method according to claim 10, wherein the composition of said vector entities includes
the input vector, which captures product design specification,
and which further comprises a requirement object associated with a customer object,
the output vector, which captures design data observed, and which further comprises component objects, sub-assembly objects, assembly objects, component or assembly design options, descriptors related to the properties of the component or assembly objects, metadata related to hierarchical dependence between the component and assembly objects, metadata related to design risks identified, metadata related to mitigation of design risks, metadata related to calculations or analysis of design components, sub-assemblies or assembles, metadata related to results from design testing, metadata related to requirement validation, metadata related to a bill of material for the design, metadata related to manufacturing option for the design, metadata related to cost of the design or metadata related to design reviews or design documentation, or metadata related to revisions of the design.

12. The method according to claim 11, wherein the definition of the customer object includes a specification of a unique identifier for the customer,
a specification of a name for the customer.

13. The method according to claim 11, wherein the definition of the requirement object includes
a specification of a unique identifier for the requirement,
a specification of a name for the requirement,
a specification of a customer with whom the requirement is associated.

14. The method according to claim 11, wherein the definition of the assembly objects includes
a specification of a unique identifier for each assembly object,
a specification of a name for each assembly object,
a specification of the requirement, or requirements, that each assembly object addresses.

15. The method according to claim 11, wherein the definition of the component objects includes
a specification of a unique identifier for each component object,
a specification of a name for each component object,
a specification either of the requirement or requirements, that each component object addresses, or of the assembly, sub-assembly, assemblies or sub-assemblies, that the component corresponding to each component object is a part of.

16. The A method according to claim 11, wherein the objects in the database with the hierarchical structure include
a master assembly object, that specify the requirements that the master level object addresses, sub-assembly objects and components, that depend on the master assembly object, and that specify the requirements that the sub-assembly or component objects address, sub-sub-assembly objects and components, that depend on the sub-assembly objects, and that specify the requirements that these sub-sub-assembly or component object address, subsequent levels of hierarchical representation of assembly objects and components, together with the requirements that these objects address, as needed to represent a design with the accuracy and detail desired.

17. The A method according to claim 11, wherein the database is structured such that component options and risks are programmed into the database based on existing engineering knowledge.

18. The method according to claim 10, wherein the method employs comparison of distribution of each data variable, either by using quantiles or another statistical test, to see if the variations are significantly different, or counting of occurrence of each label or category and comparing, or a distance measure, consisting of the Mahalanobis distance, a Euclidean distance, a Manhattan distance, a Minkowski distance, a Chebyshev distance, a Hamming distance, a Chi-square distance, a cosine similarity, a Jaccard similarity, a Sorensen-Dice index, a global distance metric or a local distance metric, and looking for big changes, or applying an absolute difference between new and old data, setting a threshold, and reporting everything exceeding the threshold, or a multi-dimensional technique, comprising a correlation matrix, principal components, relevant components, clustering, k-nearest neighbors, k-means or looking for changes, or a statistical or machine learning model, specialized for anomaly detection, consisting of supervised learning, unsupervised learning, regression, dimensionality reduction, ensemble methods, neural networks, principal component analysis, decision trees, support vector machines, t-distributed stochastic neighbor embedding, isolation forests, random forests, naïve Bayes, peer group analysis, break point analysis, transfer learning, or reinforcement learning.

19. The method according to claim 10, wherein the method utilizes an application program interface access step, for generation of an inspection plan from recognized features.

* * * * *